(12) United States Patent
Elder

(10) Patent No.: US 7,358,809 B2
(45) Date of Patent: Apr. 15, 2008

(54) METHOD FOR FORMING ELEMENTS WITH REDUCED VARIATION

(76) Inventor: J. Scott Elder, 1606 Glenwick Dr., Windermere, FL (US) 34786

( * ) Notice: Subject to any disclaimer, the term of this patent is extended or adjusted under 35 U.S.C. 154(b) by 109 days.

(21) Appl. No.: 11/269,308

(22) Filed: Nov. 8, 2005

(65) Prior Publication Data
US 2006/0125563 A1  Jun. 15, 2006

Related U.S. Application Data

(60) Provisional application No. 60/625,862, filed on Nov. 8, 2004.

(51) Int. Cl.
*H03F 3/45* (2006.01)
(52) U.S. Cl. .......................... 330/253; 330/9
(58) Field of Classification Search .............. 330/9, 330/253; 327/307
See application file for complete search history.

(56) References Cited

U.S. PATENT DOCUMENTS

| | | | |
|---|---|---|---|
| 4,464,631 A | 8/1984 | Prentice | |
| 4,827,222 A | 5/1989 | Hester et al. | |
| 5,040,035 A | 8/1991 | Gabara et al. | |
| 5,663,684 A | 9/1997 | Hebert | |
| 5,726,597 A | 3/1998 | Petty et al. | |
| 5,952,698 A | 9/1999 | Wong et al. | |
| 5,999,028 A | 12/1999 | Knoch et al. | |
| 6,396,339 B1 | 5/2002 | Jacobs | |
| 6,426,674 B1 * | 7/2002 | Davidescu | 330/9 |
| 6,515,464 B1 | 2/2003 | Darmawaskita et al. | |
| 6,614,293 B1 | 9/2003 | Sauer | |
| 6,614,305 B1 | 9/2003 | Ivanov et al. | |
| 6,628,169 B2 | 9/2003 | Ivanov et al. | |
| 6,642,877 B2 | 11/2003 | Leung | |
| 6,696,894 B1 | 2/2004 | Huang | |

(Continued)

FOREIGN PATENT DOCUMENTS

EP  0 407 848 A2  1/1991

(Continued)

OTHER PUBLICATIONS

Schouwenaars, et al; "A Low-Power Stereo 16-bit CMOS D/A Converter for Digital Audio"; IEEE Journal of Solid-State Circuits; Dec. 1988; vol. 23., No. 6; pp. 1290-1297.

(Continued)

*Primary Examiner*—Benny Lee
*Assistant Examiner*—Hieu Nguyen
(74) *Attorney, Agent, or Firm*—John L. DeAngelis; Ferdinand M. Romano; Beusse Wolter Sanks Mora & Maire, P.A.

(57) ABSTRACT

The performance of precision analog integrated electronic circuits is directly related to the degree of matching between electrical circuit elements. Any residual mismatch of circuit elements after manufacturing must be calibrated out using numerous techniques such as adjusting potentiometers, trimming capacitors, modifying binary-weighted resistor strings, etc. Prior art matching techniques entail the use of large area circuit elements or a large number of elements arranged in a prescribed manner on the surface of a silicon die to minimize the residual calibration. The present invention utilizes a multiplicity of circuit elements that are interconnected in distinct groups to achieve a higher degree of element matching and the ensuing benefits thereof. The elements are interconnected to yield a prescribed minimum mismatch error.

18 Claims, 20 Drawing Sheets

U.S. PATENT DOCUMENTS 6,724,336 B2    4/2004   Leung et al.
2003/0184459 A1   10/2003   Engl

OTHER PUBLICATIONS

Pelgrom, et al; Matching Properties of MOS Transistors; IEEE Journal of Solid-State Circuits; Oct. 1989; vol. 24, No. 5; pp. 1433-1440.

Michael, et al; "Statistical Modeling of Device Mismatch for Analog MOS Integrated Circuits"; IEEE Journal of Solid-State Circuits; Feb. 1992; vol. 27, No. 2,; pp. 154-166.

Flynn, et al; "Digital Calibration Incorporating Redundancy of Flash ADCs"; IEEE Transactions on Circuits and Systems; May 2003; vol. 50, No. 5; pp. 205-213.

Kinget, Peter; "Device Mismatch and Tradeoffs in the Design of Analog Circuits"; IEEE Journal of Solid-State Circuits; Jun. 2005; vol. 40, No. 6; pp. 1212-1224.

Gan, et al; "Design and Modeling of a 16-bit 1.5MSPS Successive Approximation ADC with Non-binary Capacitor Array"; GLSVLSI, Apr. 2003; pp. 161-164.

* cited by examiner

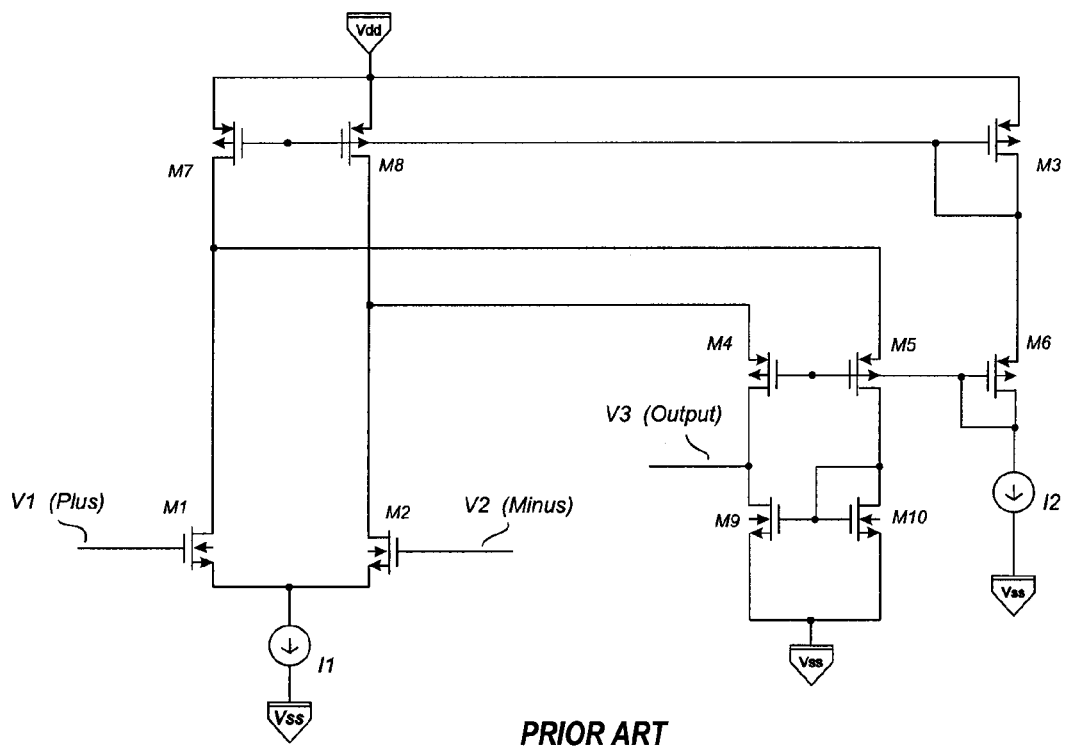
PRIOR ART
FIGURE 1

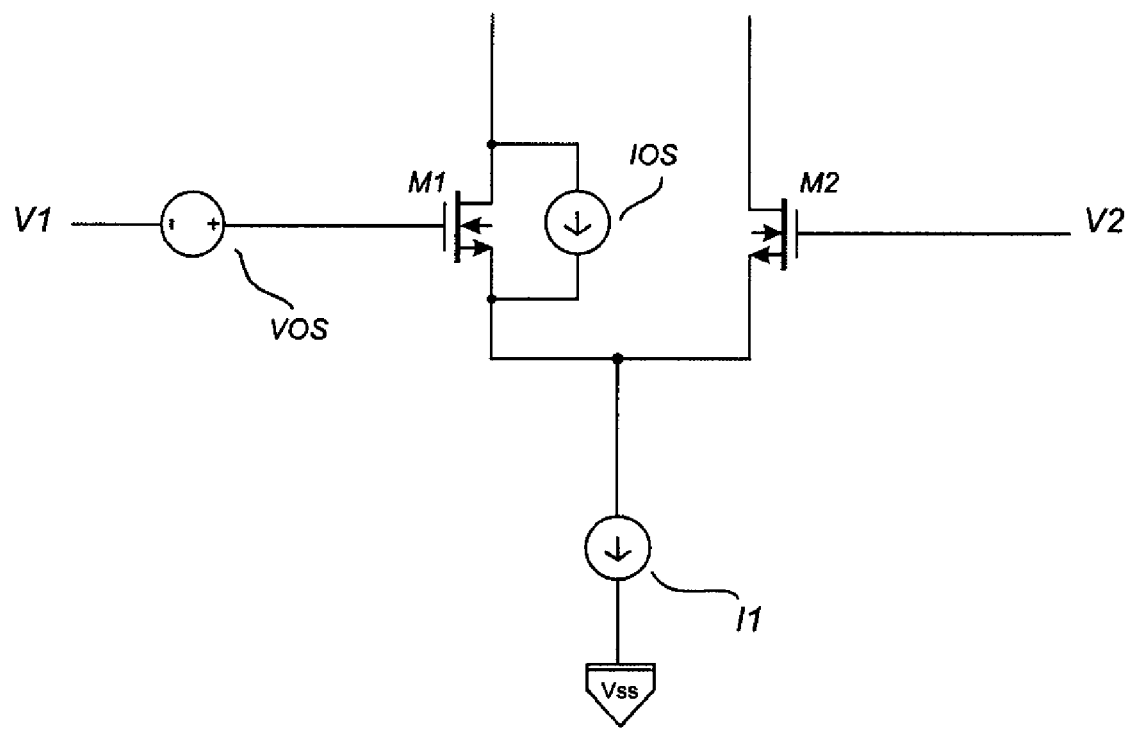
PRIOR ART
FIGURE 2

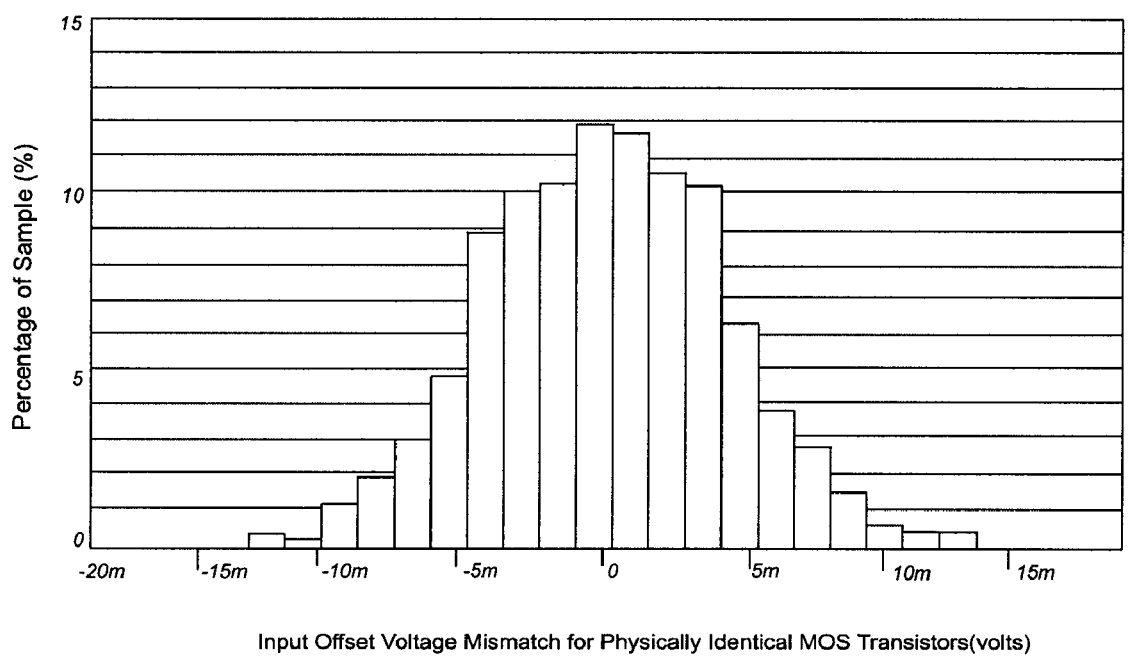
Input Offset Voltage Mismatch for Physically Identical MOS Transistors(volts)
*PRIOR ART*
FIGURE 3

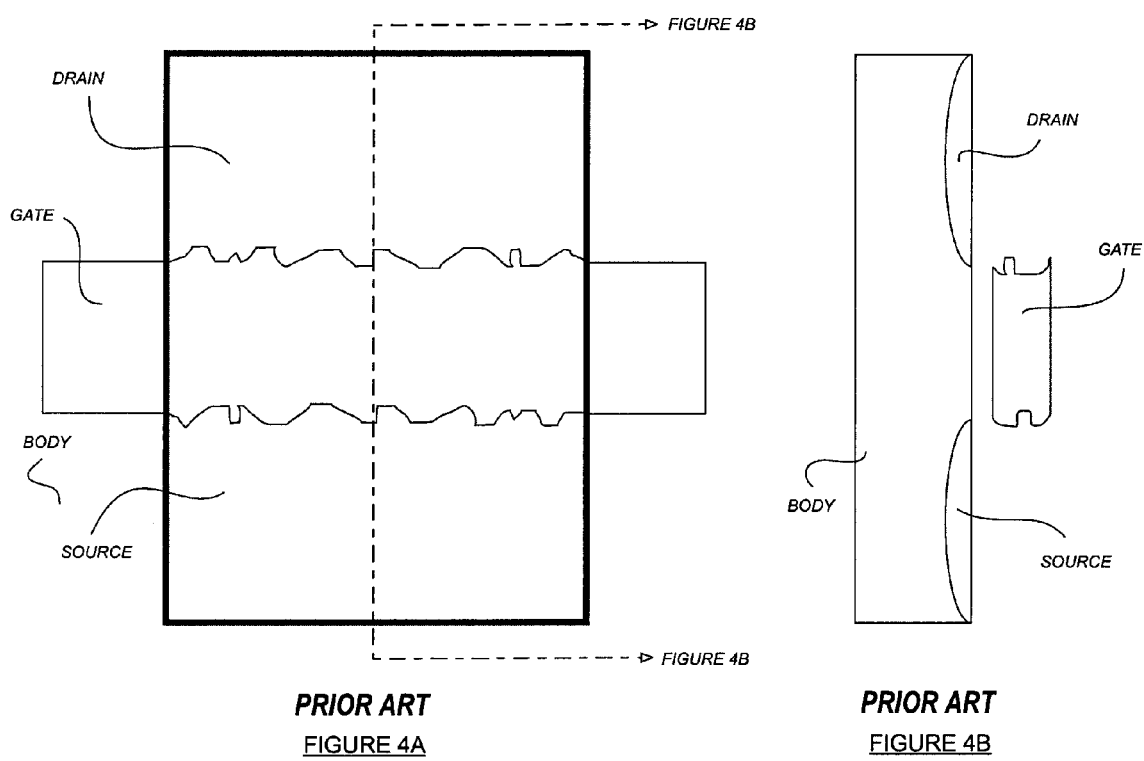
PRIOR ART
FIGURE 4A
PRIOR ART
FIGURE 4B

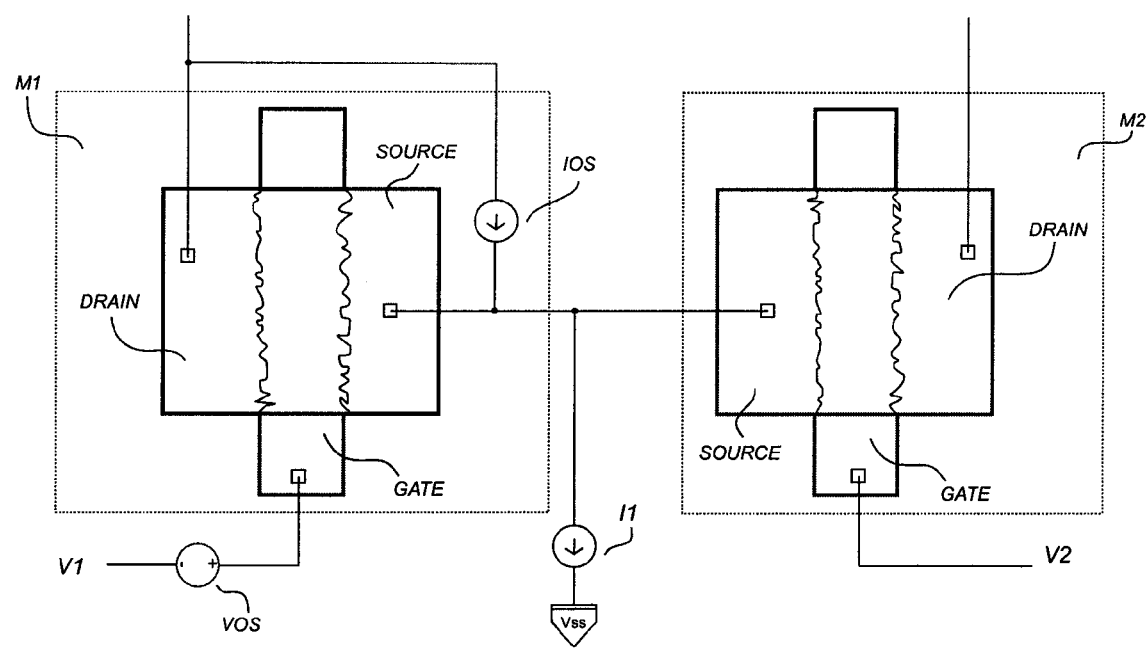
PRIOR ART
FIGURE 5

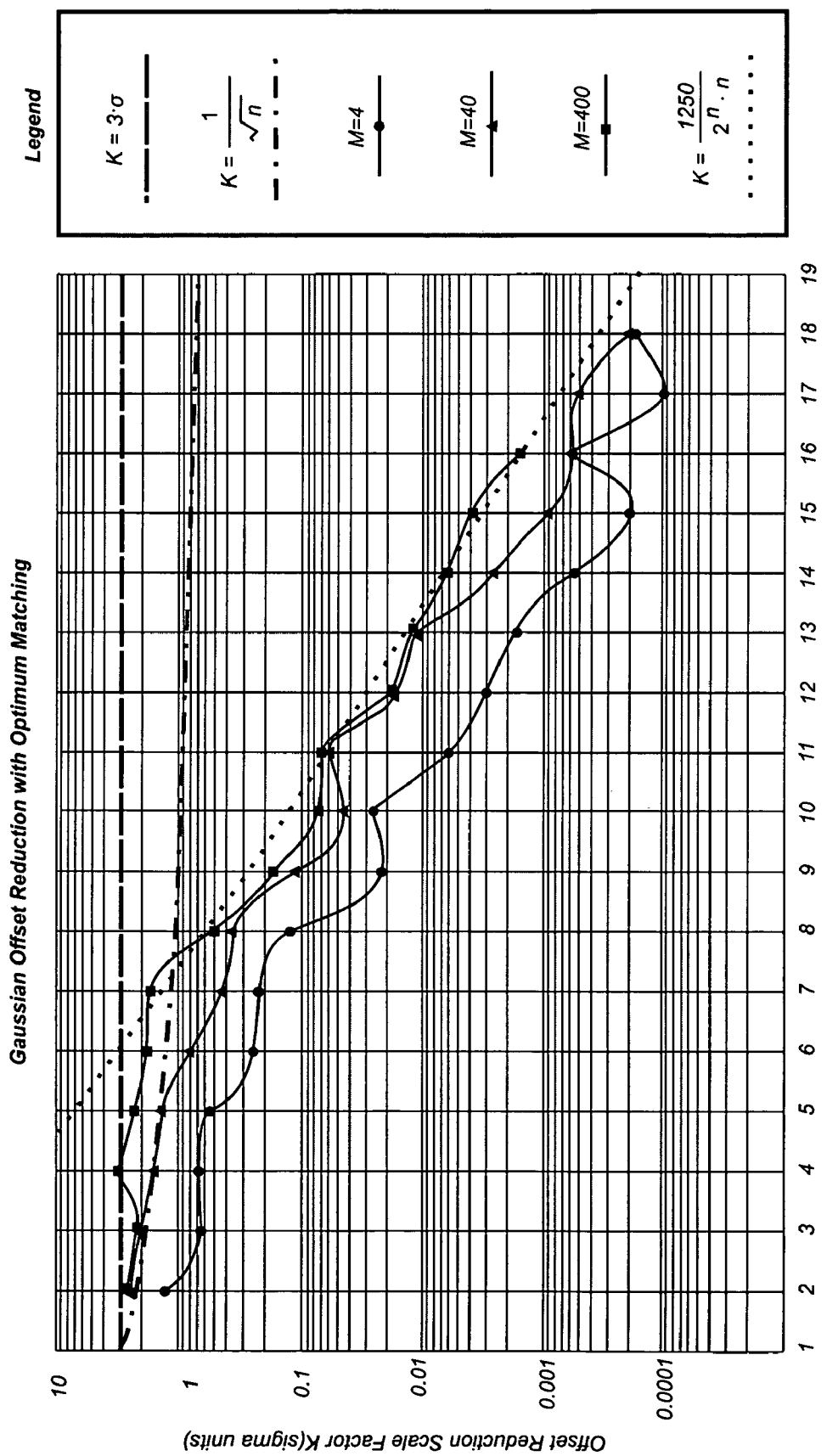
FIGURE 6

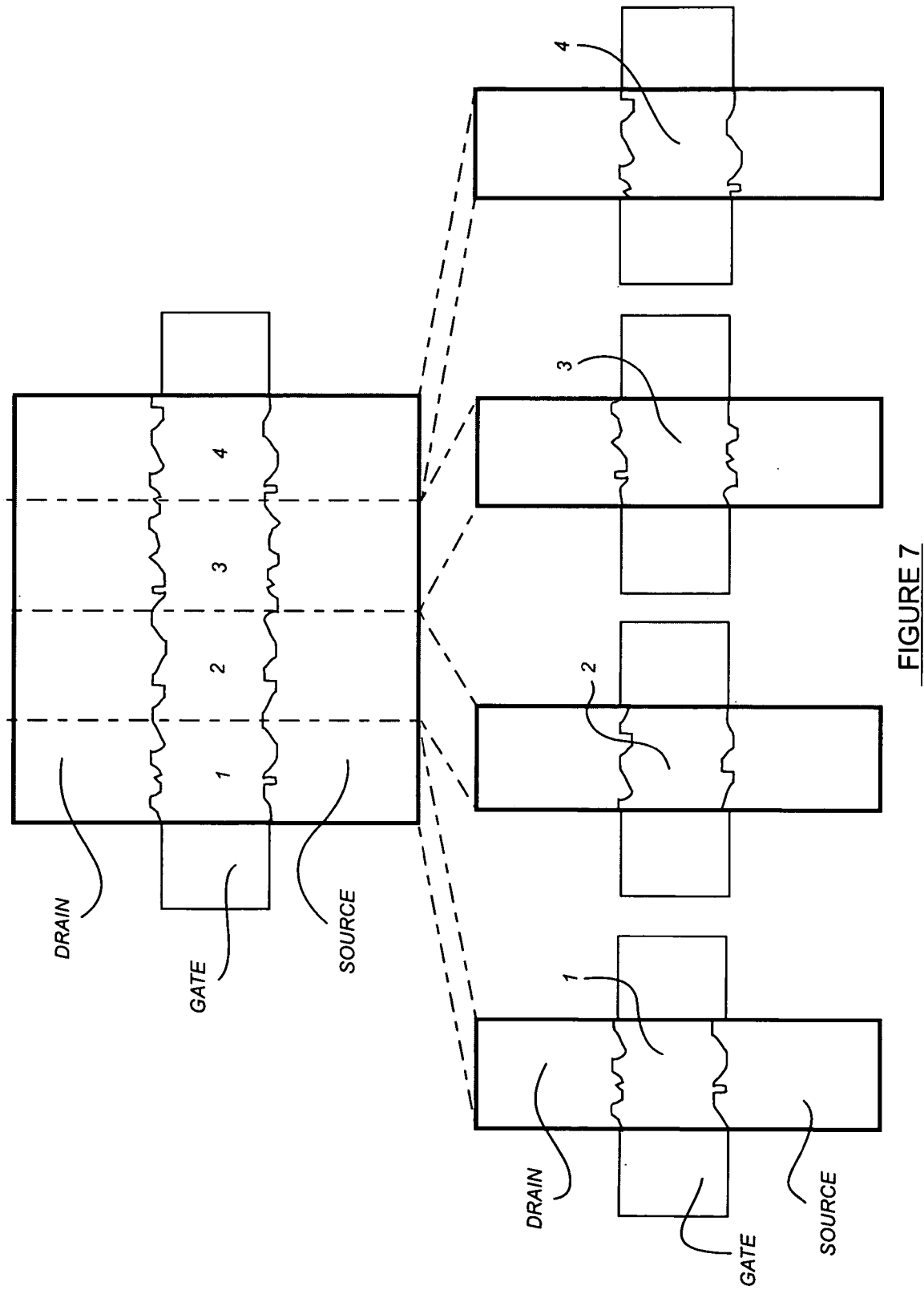
FIGURE 7

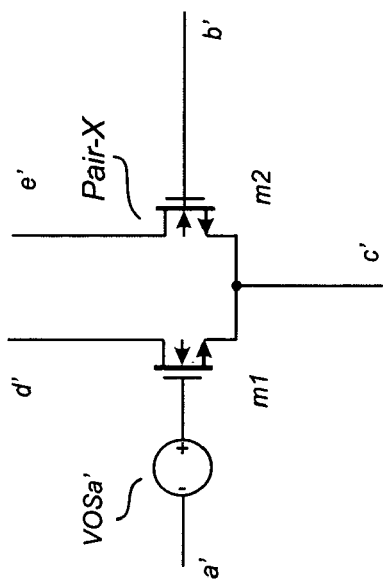
FIGURE 8B
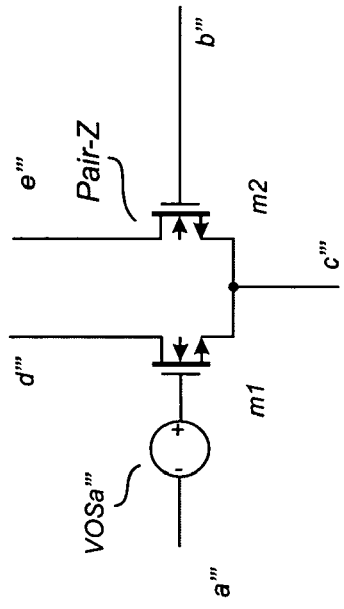
FIGURE 8D
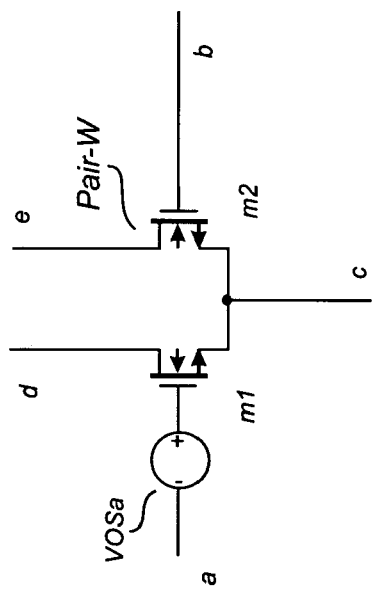
FIGURE 8A
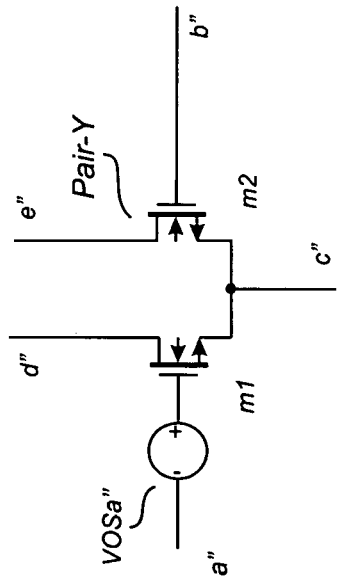
FIGURE 8C

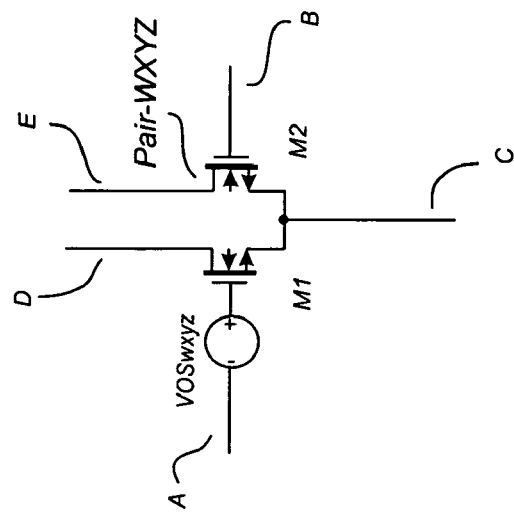
FIGURE 9B
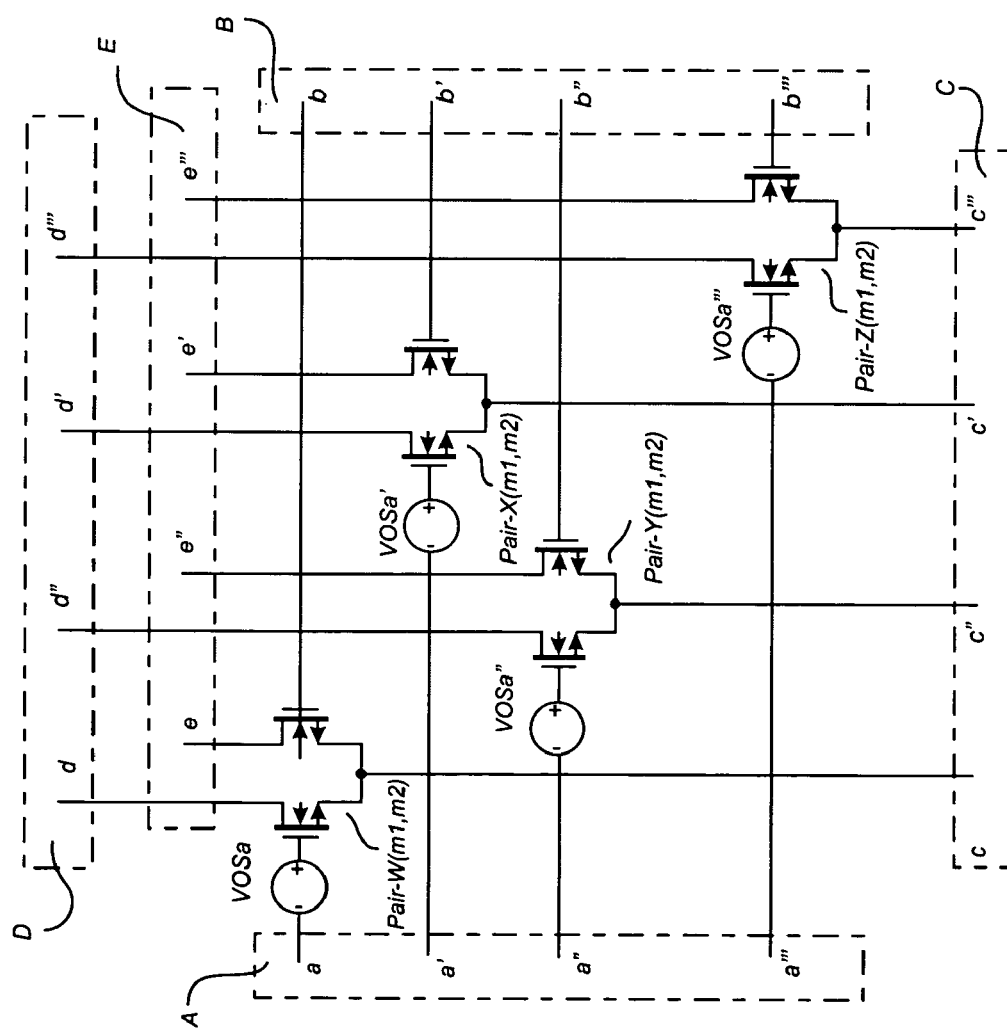
FIGURE 9A

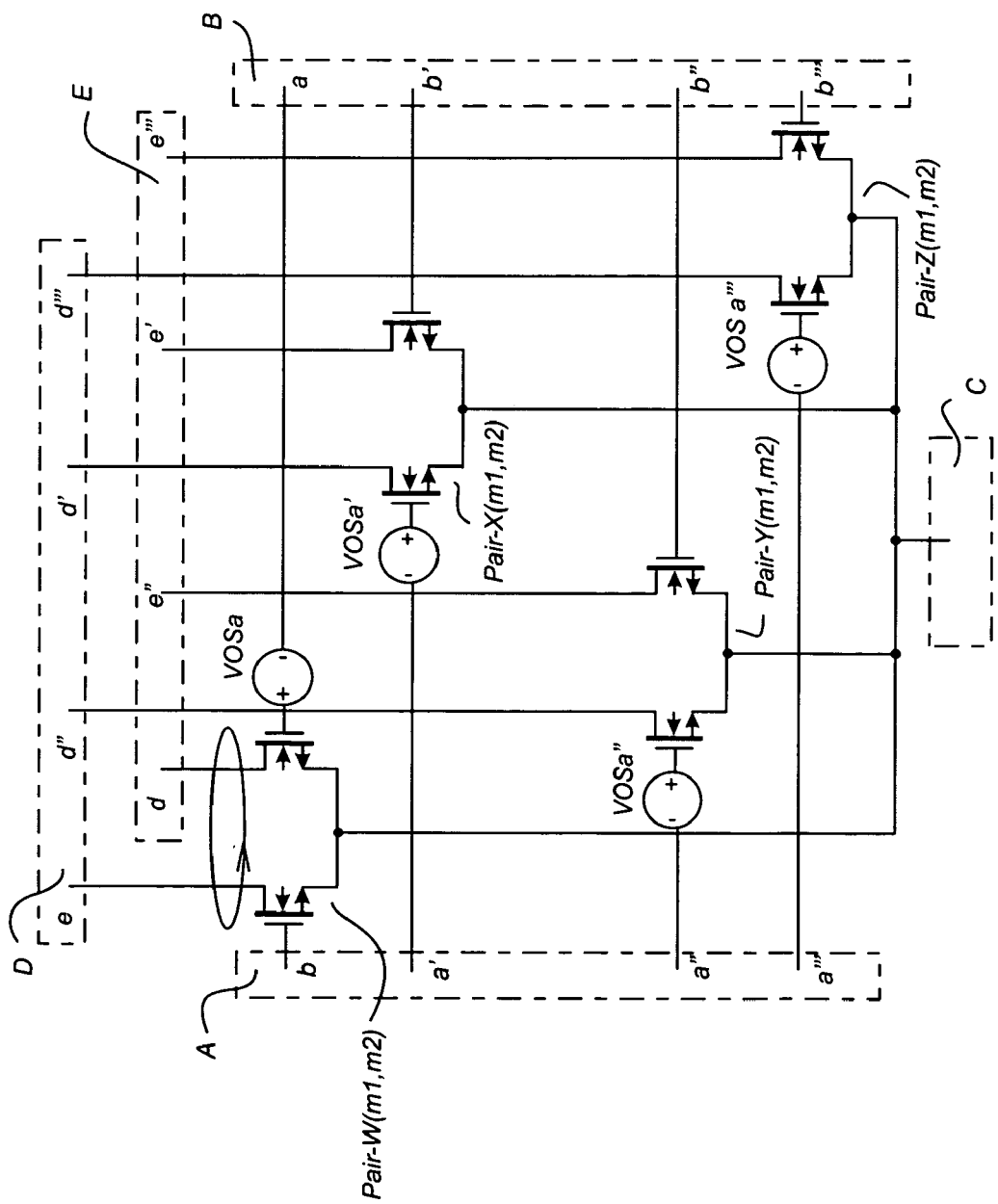
FIGURE 10

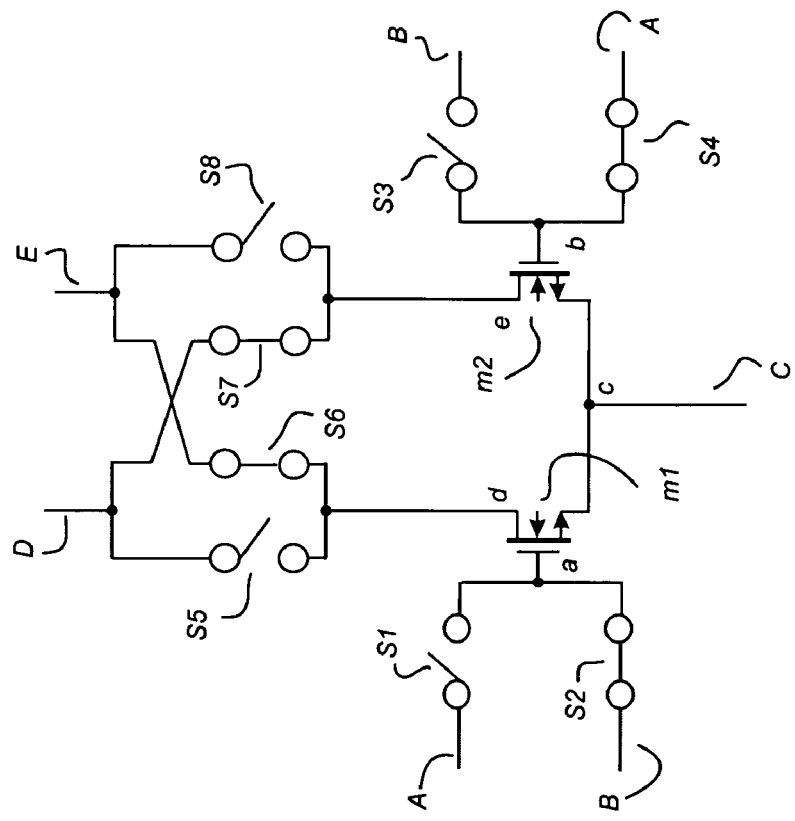
FIGURE 11B
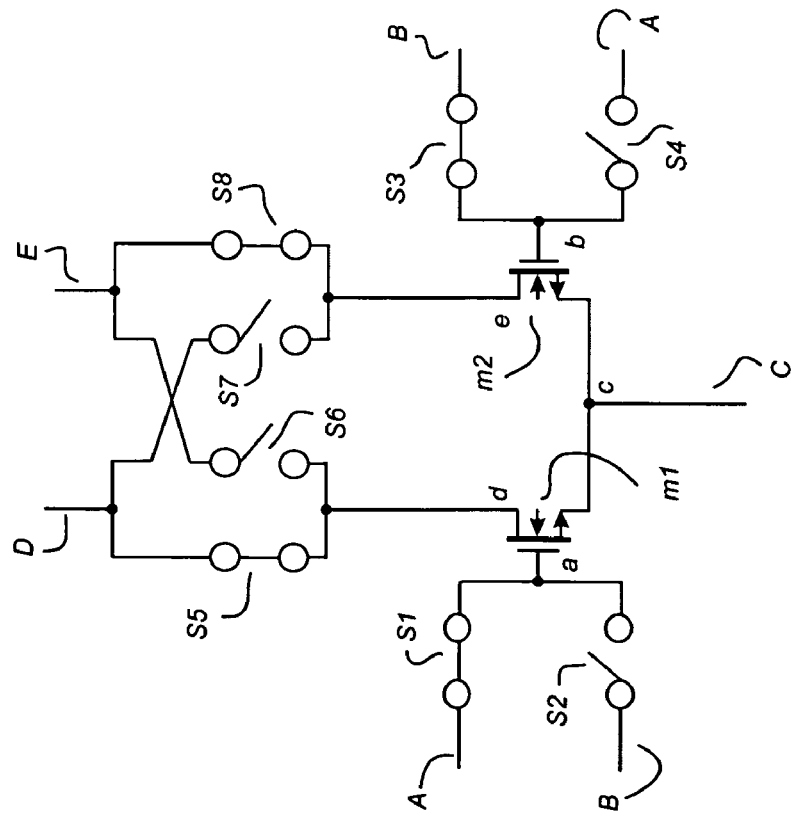
FIGURE 11A

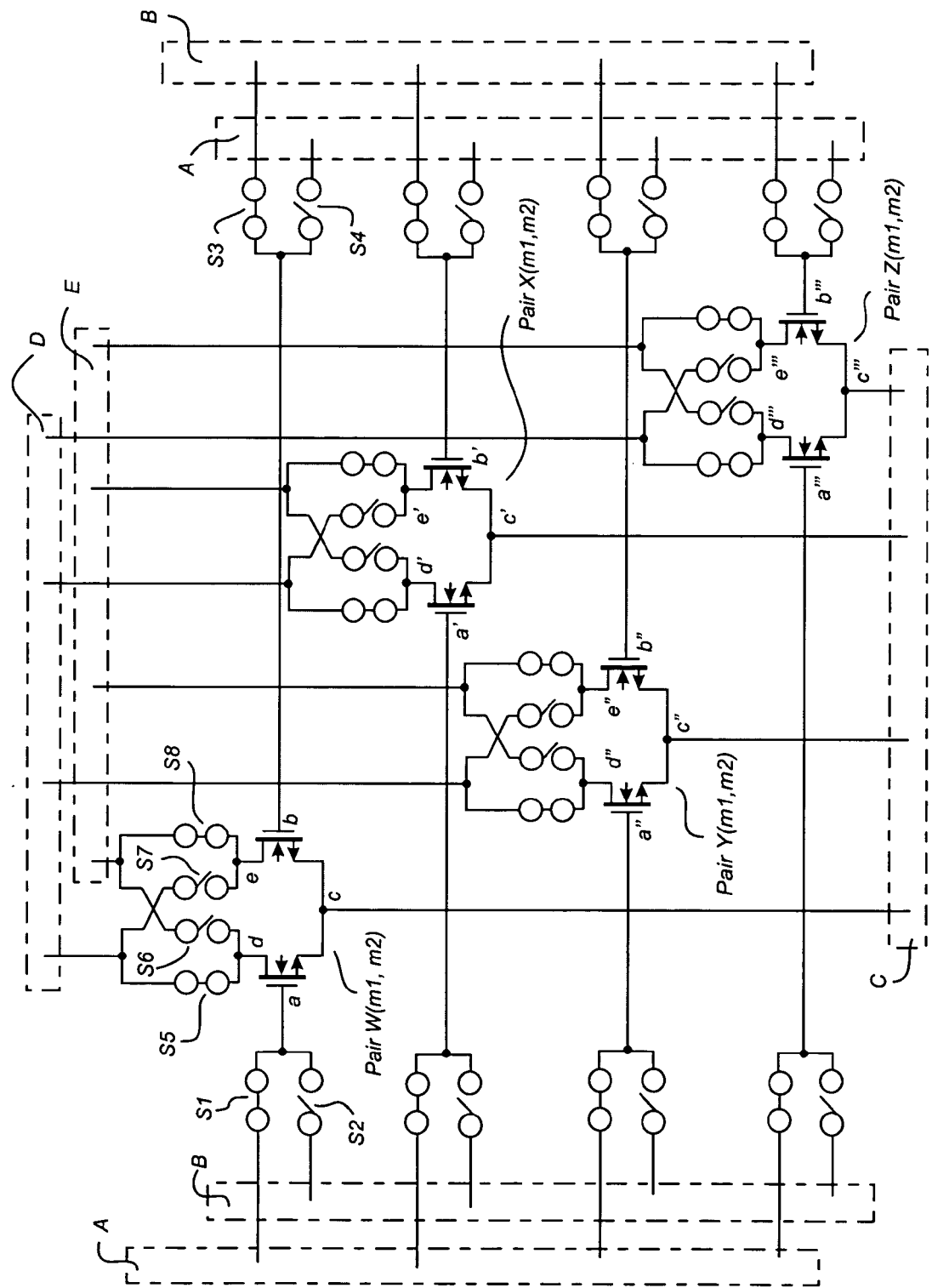
FIGURE 12

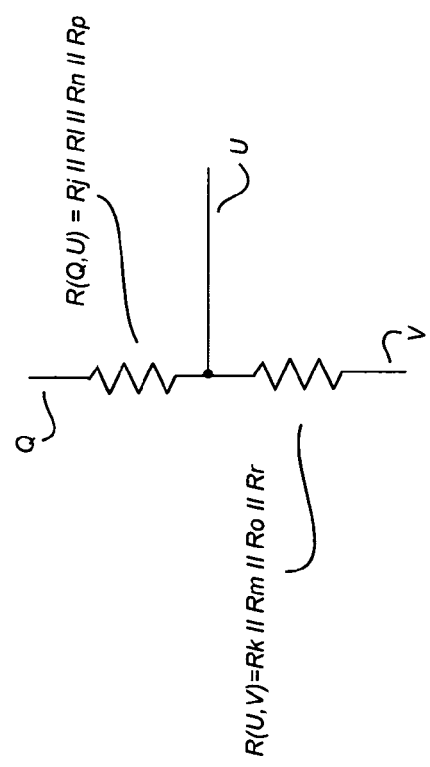
FIGURE 13A
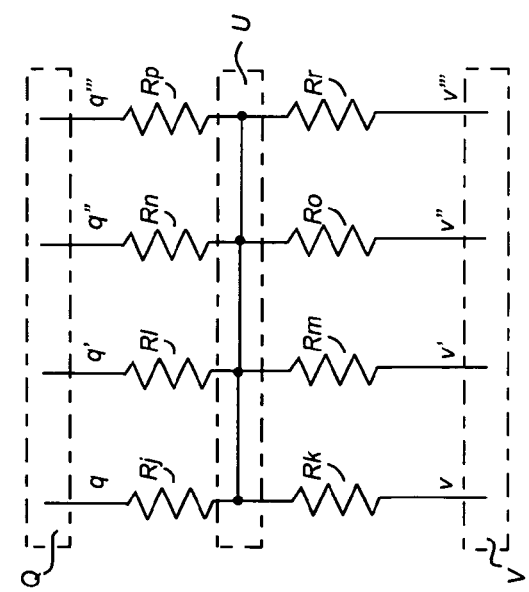
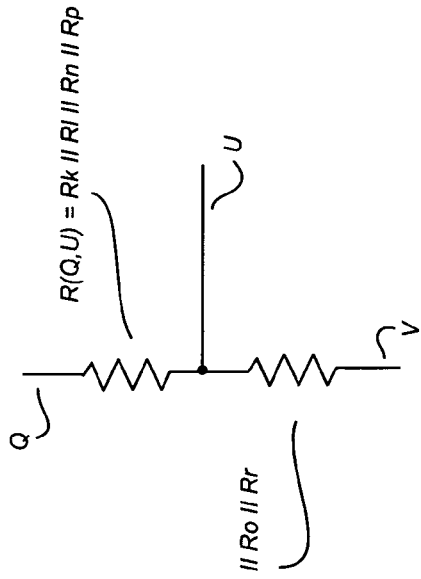
FIGURE 13B
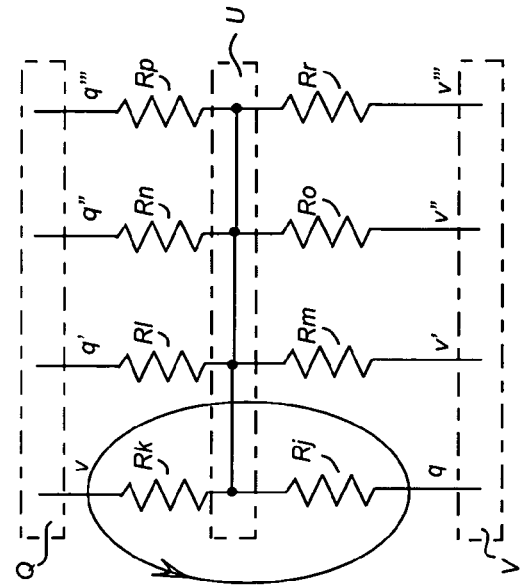

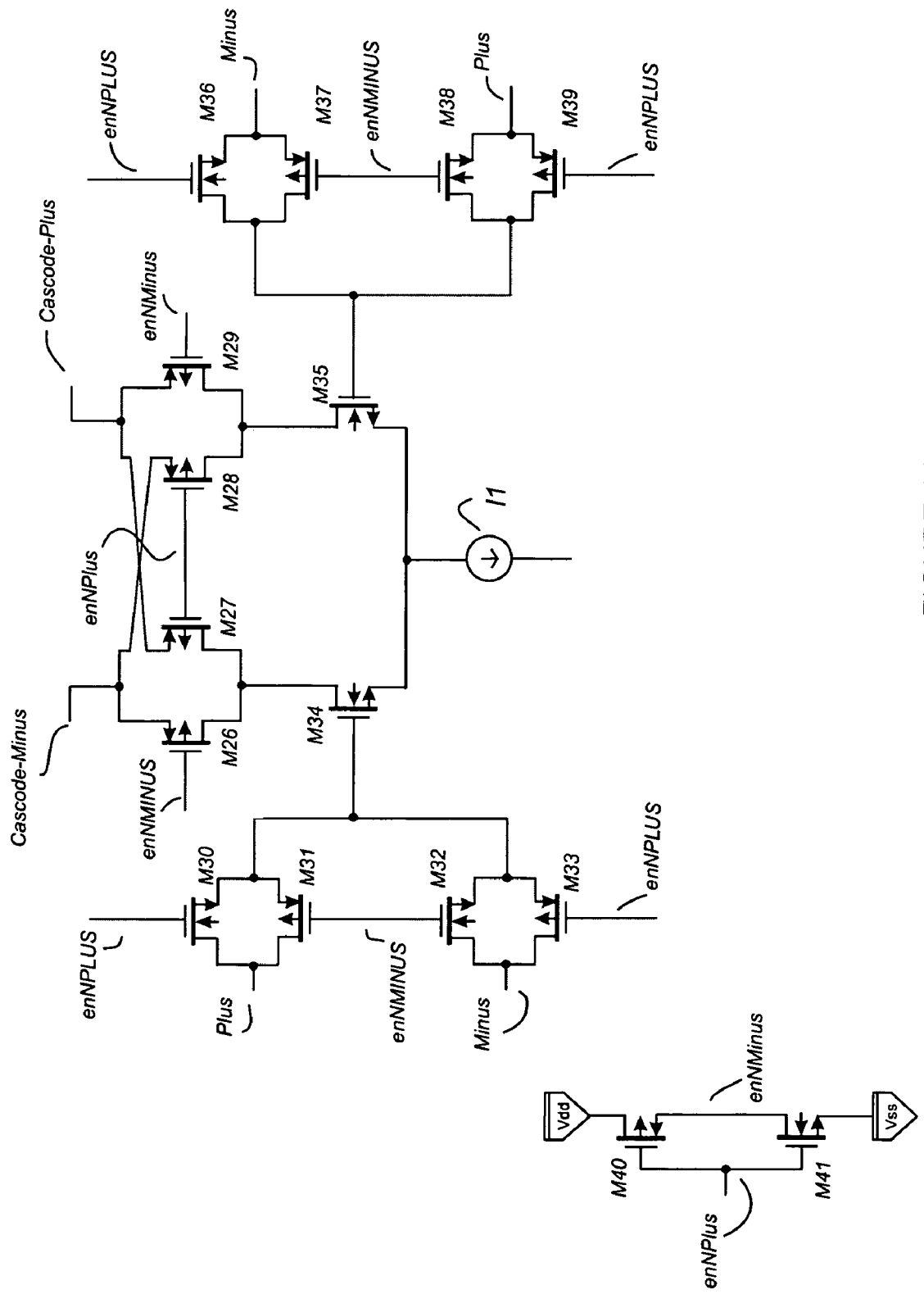
FIGURE 14

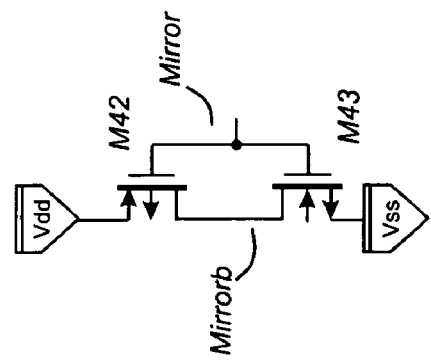
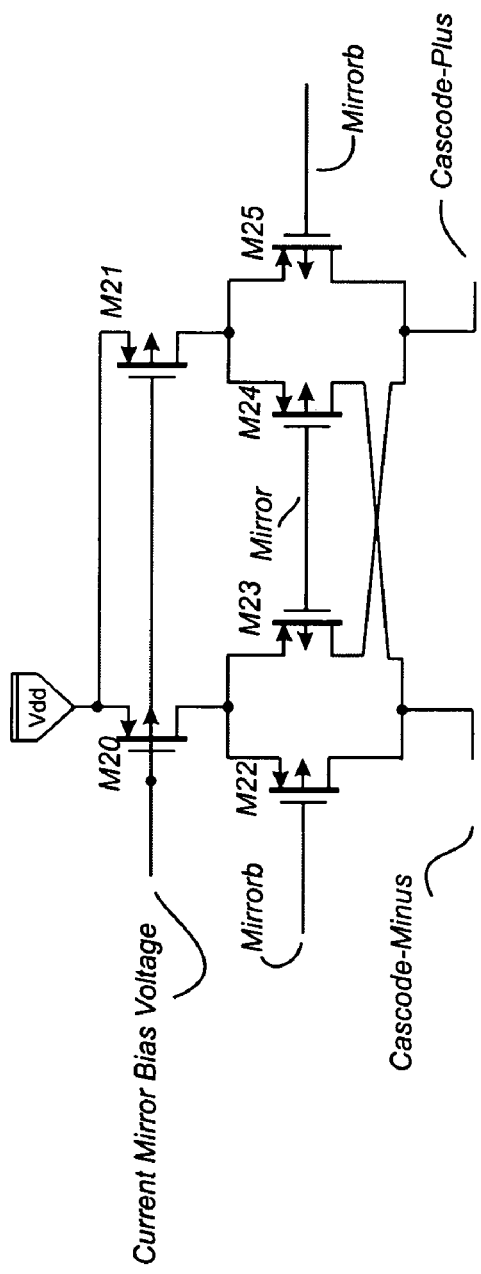
FIGURE 15A

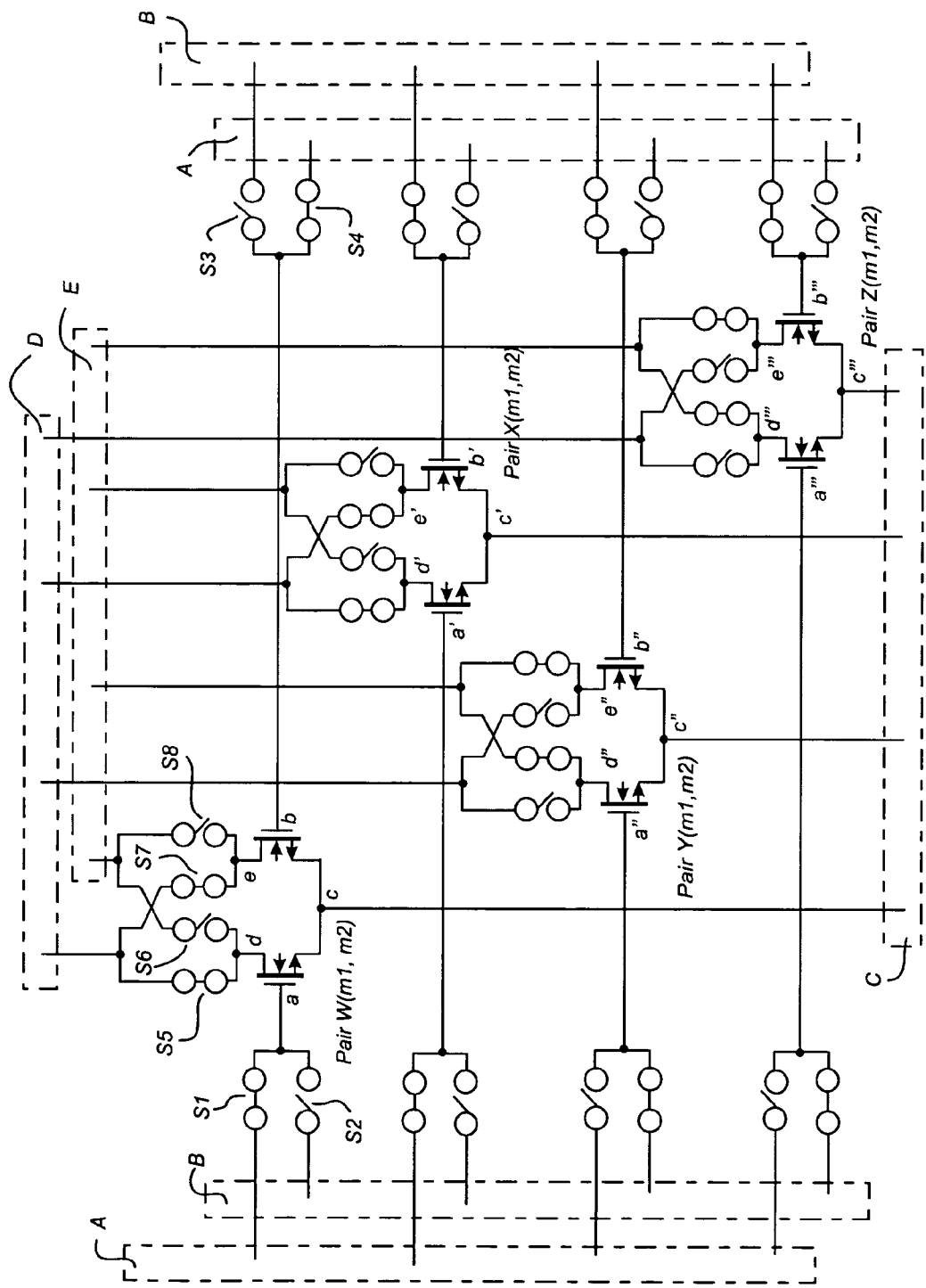
FIGURE 16

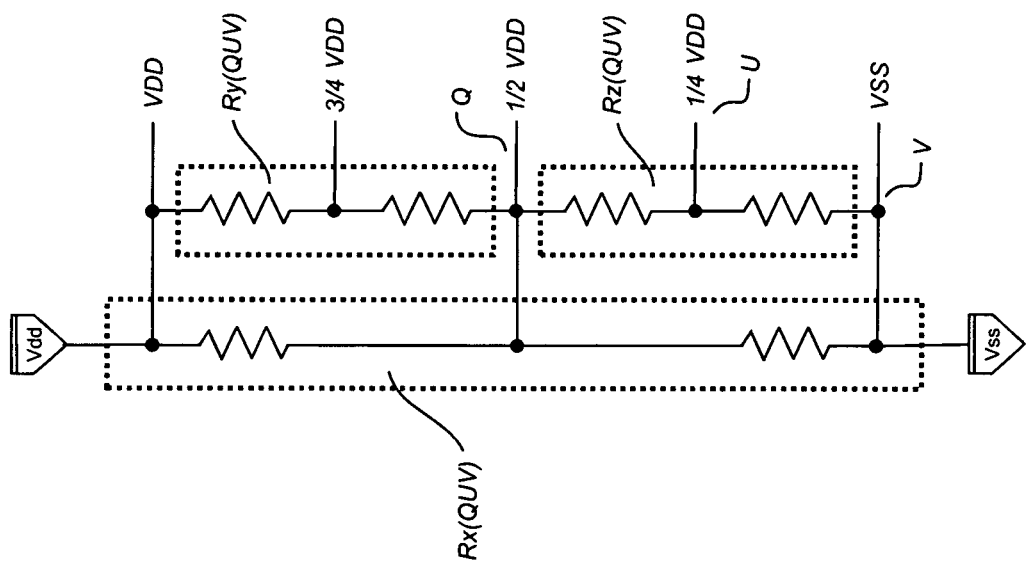
FIGURE 17

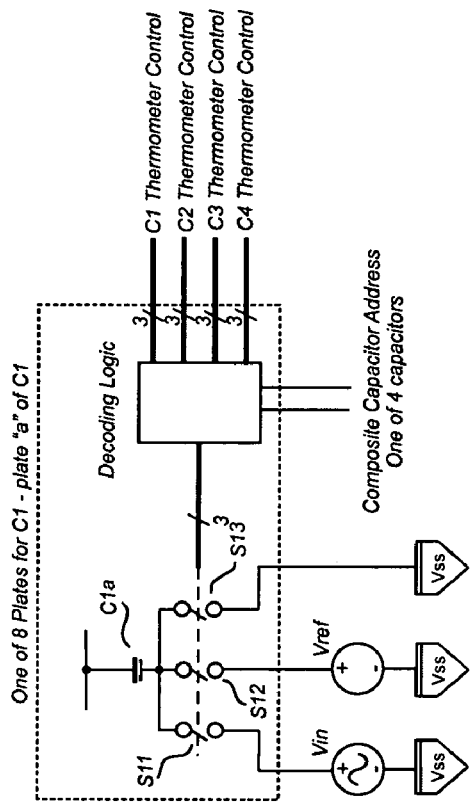
FIGURE 18B
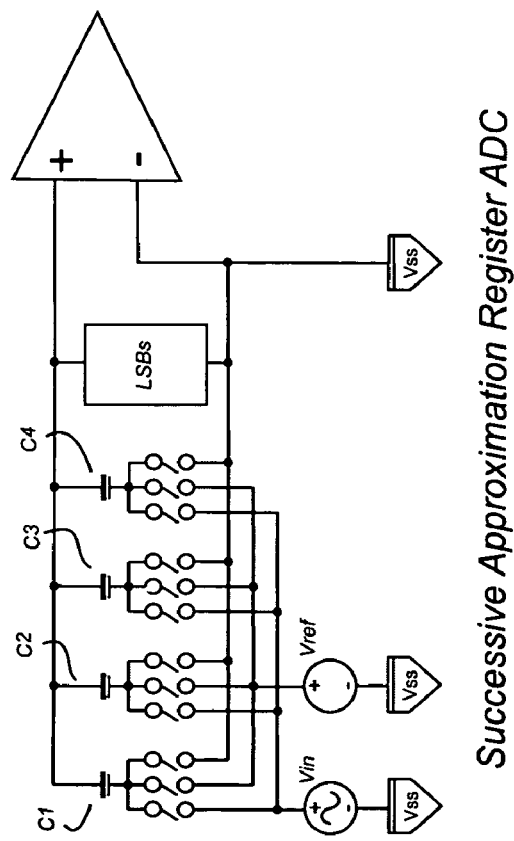
FIGURE 18A

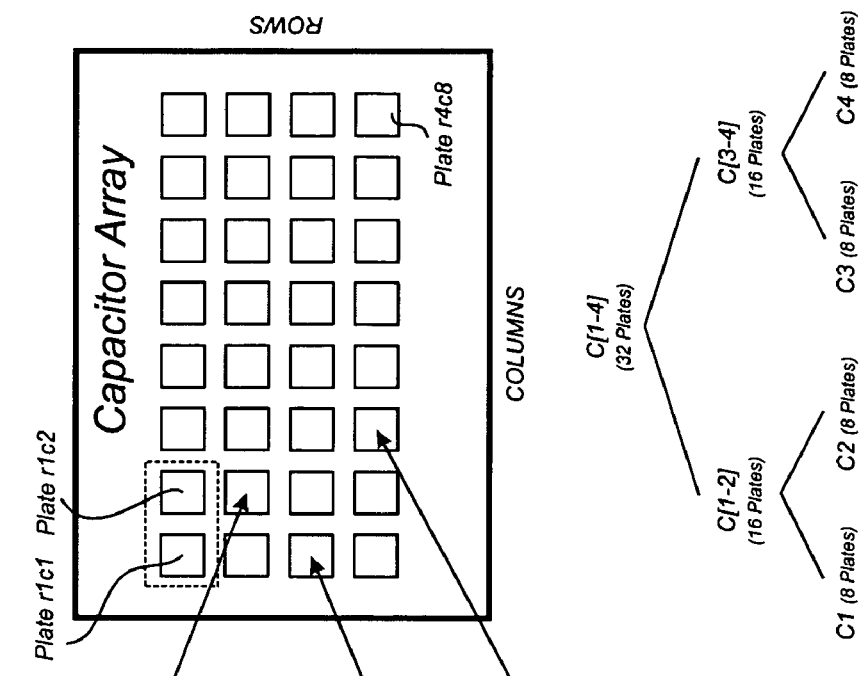
FIGURE 19B
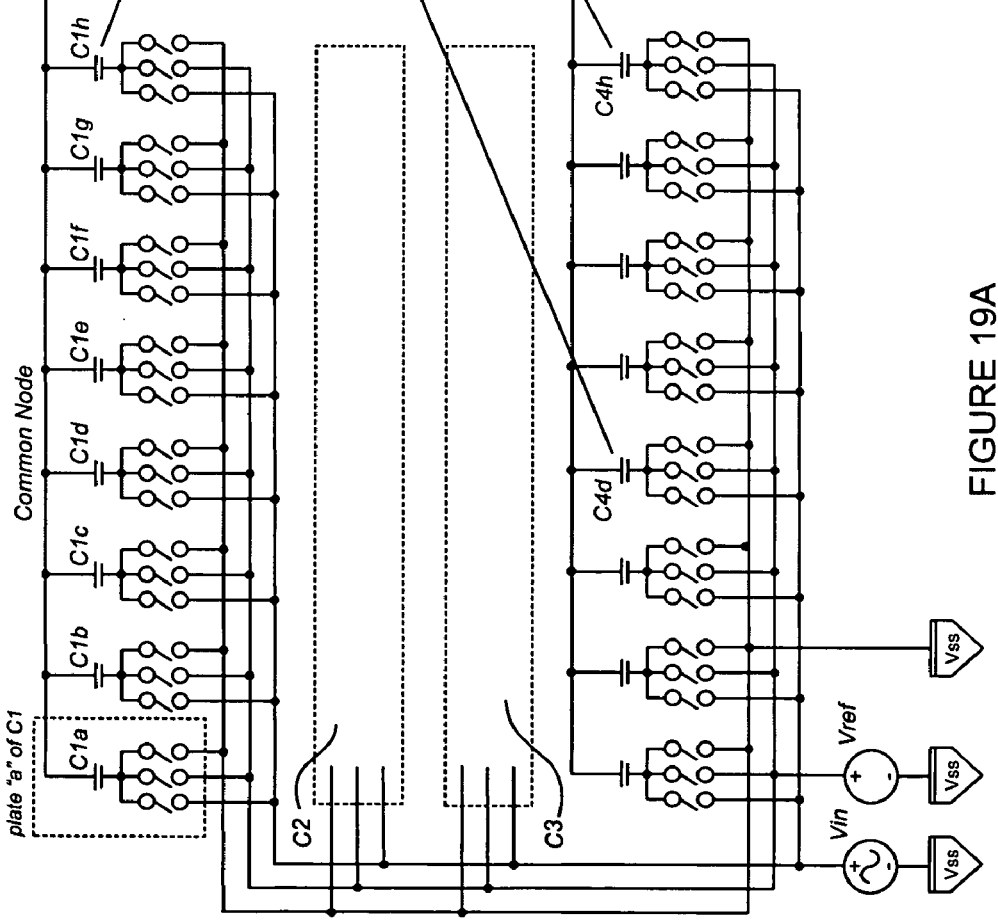
FIGURE 19A

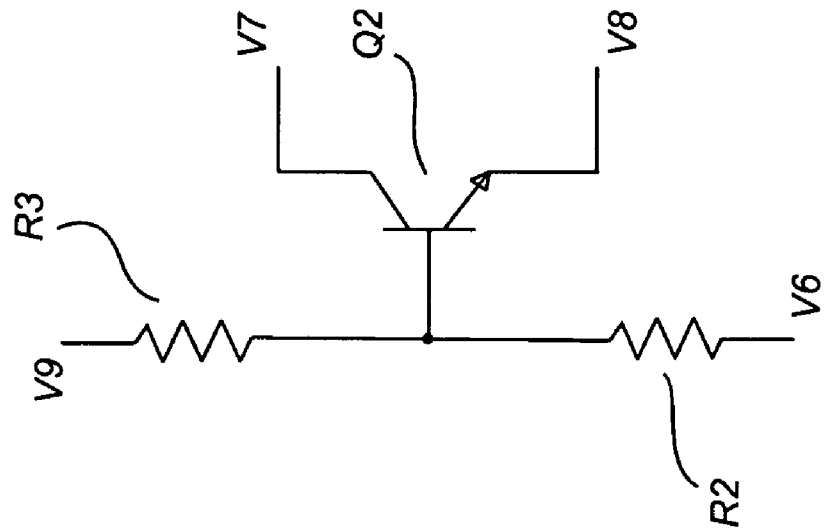
FIGURE 20B
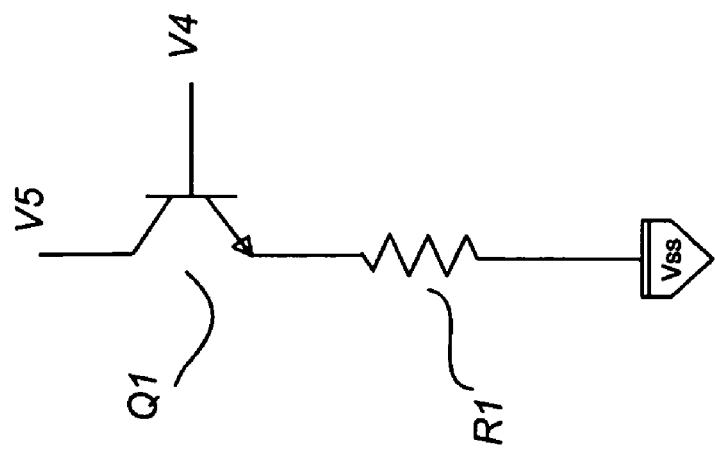
FIGURE 20A

METHOD FOR FORMING ELEMENTS WITH REDUCED VARIATION

This application claims the benefit of U.S. Provisional Patent Application No. 60/625,862 filed on Nov. 8, 2004.

TECHNICAL FIELD OF THE INVENTION

This invention relates generally to methods and apparatuses for calibrating precision analog integrated electronic systems. In particular, this invention details novel and non-obvious methods and apparatuses for calibrating out manufacturing errors inherent in high precision, analog integrated circuits. While the invention described herein is discussed in terms of analog integrated electronic circuits, the invention is further applicable to the calibration of any physical product where precise control of a relationship between elements is required. In the case of analog integrated circuits, the calibration of product specifications such as operational amplifier input offset voltage, offset voltage drift, bandgap voltage reference tolerance, operational amplifier common-mode and power supply rejection ratios and others can benefit from this invention.

BACKGROUND OF THE INVENTION

In analog integrated circuits such as an integrated operational amplifier, the input offset voltage is an important performance specification. In an ideal differential amplifier, a common building block of operational amplifiers, when the difference between the two input signals is zero, the output is zero. However, a practical differential amplifier exhibits an unbalance caused by mismatches in the characteristics of the two input transistors. The input offset voltage is an error voltage that must be applied to the input terminals to balance the output voltage and overcome the effects of the transistor unbalances. The input offset voltage is added to an input signal at the amplifier's input terminals. This error voltage is a performance limiting aspect of all practical amplifiers. It is therefore a primary goal of precision analog integrated circuit design to minimize this input offset voltage.

For well-designed amplifiers the offset voltage is determined primarily by the mismatch of the transistor elements that make up the input differential pair.

FIG. 1 is an example of a folded-cascode, one stage operational amplifier comprising differential input transistors M1 (MOSFET or metal-oxide semiconductor field effect transistors) and M2 responsive respectively to differential input signals V1 and V2. The differential pair M1/M2 is subject to an offset voltage error as described above.

In addition to the differential input pair M1/M2, there are eight other transistors in FIG. 1 that work together to convert the differential input voltage at V1 and V2 into a single-ended output voltage at V3.

Transistors M7 and M8 are current sources whose current is determined by the current source I2 and the transistor gain relative to the diode connected reference transistor M3. Transistors M7 and M8 enable a reflection of the differential current flowing out of transistors M1/M2 into the active-load current mirror comprised of M9 and M10.

Transistors M4 and M5 control the voltage at the drain terminals of M1 and M2 so the amplifier can operate with a wide output voltage swing at V3. The transistors M3 and M6 provide voltage bias at the gate terminals of M7/M8 and M4/M5 respectively.

To insure that the input offset voltage of the amplifier shown in FIG. 1 is determined primarily by the mismatch between transistors M1 and M2, the transconductance of M7/M8 and M9/M10 must be substantially less than the transconductance of M1/M2. In practice this is not always possible. As such, all three differential pairs contribute to the input offset voltage of the amplifier shown in FIG. 1.

FIG. 2 shows differential NMOS transistors M1 and M2 and an input voltage source VOS in series with the gate node of the transistor M1. Voltage source VOS represents the error voltage associated with the input offset voltage that results from mismatches between the differential transistor pair comprising M1 and M2 in FIG. 2. Alternatively, it is equally acceptable to indicate the input pair offset in terms of an output offset current. Such a current is shown in FIG. 2 as IOS. IOS and VOS are related in that IOS is the difference between the drain currents of M1 and M2 when the gate terminals of M1 and M2 are shorted together. For a perfectly matched, differential pair, IOS would be equal to 0 A.

Amplifiers such as that in FIG. 1 are well known by those skilled in the art of analog integrated circuit design. Significant literature exists in the public domain to completely explain the operation of such an amplifier.

The mismatch of integrated elements manufactured according to a well-designed semiconductor process is a result of random manufacturing imperfections. These manufacturing imperfections include many factors such as lithography errors, process gradients, and chemical etching rate variations, among others.

For like-sized elements operated in identical environments on a single die, it is well understood that the distribution of mismatch exhibits a Gaussian or normal distribution. Such a relationship is more typically called a "bell-curve" distribution owing to the graphical shape of the distribution. The mathematics behind statistical manufacturing process distributions such as the normal distribution above is well documented in textbooks and research papers and well understood by those skilled in the art of analog integrated circuit design. Those works should be consulted for detailed explanations of statistical process distributions and the terms associated therewith.

An example of a typical Gaussian transistor mismatch distribution is shown in FIG. 3. While the data in FIG. 3 relates to MOS transistor mismatches, similar distributions are observed for other integrated electronic elements such as bipolar transistors, resistors, capacitors, and others. While the characteristic shape is similar, the standard deviation of the mismatch for other circuit components can vary greatly from that illustrated in FIG. 3 and for parameters other than voltage.

For example, integrated capacitors built using a modern CMOS semiconductor process using two layers of polysilicon for the capacitor plates achieve substantially greater matching for a given element area versus resistors of equal area. Additionally, MOS (metal oxide semiconductor) transistors match more poorly than resistors while bipolar transistors match substantially better than MOS transistors. Since the distribution of mismatch for bipolar transistors is less than that of MOS transistors, one typically finds precision low-offset voltage amplifiers built using bipolar transistors rather than MOS transistors.

To ensure a high manufacturing yield of a precision amplifier given a Gaussian manufacturing distribution of mismatch, a product designer generally designs assuming a 3 or 4-sigma standard deviation distribution of transistor mismatch. For the distribution shown in FIG. 3, the 3-sigma distribution of offset voltage mismatch is nearly 15 mV. Any amplifier designed with transistors that exhibit the mismatch distribution of FIG. 3 must anticipate at least a 15 mV initial input offset voltage prior to calibration.

Prior art techniques for post-manufacturing calibration of an analog integrated circuit entail the modification of an additional circuit element to aid in the final calibration of the performance specification. These additional circuit elements include among other things, resistive potentiometers, trimming capacitors, programmable resistor dividers, laser trimable resistors, trim-able current sources, etc. These additional circuit elements not only add materials cost to the production of a system, but they also add labor costs since time is required to perform the calibration. Furthermore, if the circuit elements used for calibrating are not precisely the same as those used in the primary matching circuit, the performance of the calibration will degrade as operating environments change since dissimilar elements exhibit dissimilar drift characteristics. The magnitude of drift is generally related to the amount of initial offset prior to correction. It is preferred to have a minimum mismatch prior to calibration to insure that the drift is also minimized.

Fifteen-millivolts of input offset voltage is considered poor by those skilled in the art of precision analog amplifier design. Such a poor specification is not indicative of a high precision amplifier design. Furthermore, it is well understood by those skilled in the art that any calibration of such a large error will not be well maintained over environmental changes, such as time and temperature, during amplifier operation. As such, design techniques must be utilized to minimize the mismatch prior to calibration that in turn will minimize the post calibration drift.

It is well known by those skilled in the art of analog integrated circuit design that the typical mismatch observed between two integrated elements is inversely proportional to the square root of the area of the elements. In other words, the mismatch between one pair of elements that is four times larger than another pair can be expected to be better by a factor of 2, the square root of 4. Therefore, one important design technique to minimize the mismatch of a differential transistor input pair is to make the structures physically large.

However, using a large physical structure on a silicon die is an expensive solution to achieve matching since this adds materials cost. In many cases it further degrades other equally important performance specifications. For example, as the size of a physical structure increases so does the parasitic capacitance of the same structure. In the case of a resistor, this higher capacitance lowers the bandwidth of the resistor and hence the bandwidth of an analog circuit employing the resistor. Many times the bandwidth of an analog circuit is nearly as important as the matching requirements; therefore tradeoffs must be made between matching and bandwidth during the design phase.

FIG. 4A shows a top-down view of a MOS transistor, including drain, source, gate, and body regions. The transistor exhibits one source of mismatch error in MOS transistors; random channel length variations. FIG. 4B shows a cross-sectional view of the same MOS transistor taken along the plane 4B.

When the gate electrode of a MOS transistor is formed during manufacturing, a multiplicity of random error-generating events occur such that the gate electrode is not formed with a perfectly flat edge along the width of the MOS channel. These random events include, among other things, photolithographic errors and gate electrode etching rate variations. A MOS transistor with a non uniform gate electrode edge will exhibit a varying channel length across the width of the MOS transistor. Random channel length variations directly affect MOS transistor threshold voltage.

The depiction of the transistor mismatch error source shown in FIGS. 4A and 4B is greatly exaggerated and an over simplification of the manufacturing anomalies that lead to mismatched performance between identically sized MOS transistors manufactured simultaneously. There are numerous other manufacturing abnormalities that contribute to the mismatch of MOS transistors. Two other such abnormalities include random fixed charge variations in the gate oxide underneath the gate electrode and random variations in drain/source lateral diffusion profiles.

It is the accumulation of all manufacturing error sources during MOS transistor manufacturing that result in MOS transistor pair mismatch. When a chart such as that shown in FIG. 3 is presented, it is normally assumed by those skilled in the art that the distribution depicted includes all mismatch error sources, not only MOS channel length variation.

FIG. 5 shows how two randomly mismatched MOS transistors would be interconnected to form an input differential pair such as the input pair shown in FIG. 1 and FIG. 2. The circuit interconnection shown in FIG. 5 constitutes a mismatched pair of MOS transistors.

FIG. 5 also shows the input offset voltage error source VOS and the equivalent current error source IOS. FIG. 5 is a physical depiction of the electrical schematic shown in FIG. 2 and is intended to represent a practical, albeit simplistic, example of mismatch found in modern MOS analog amplifier products.

An object of integrated analog amplifier design is to minimize mismatch errors such as those shown in FIG. 5. A prior art technique to achieve such a minimization is to build M1 and M2 as physically large structures on the silicon die, as described above. It is well understood by those skilled in the art of analog amplifier design that the improvement factor achievable by using large MOS transistors is inversely proportional to the square root of the increase in gate area of the transistor. In simpler terms, matching improves as transistors become larger.

FIG. 7 shows one MOS transistor that is divided into four equal sized transistors. One could manufacture two separate transistors from the four individual transistors by permanently connecting in parallel the transistors with gates 1 and 3 and connecting in parallel the transistors with gates 2 and 4. This is a prior art example of building transistors from a multiplicity of transistors that are permanently interconnected interdigitally across the surface of a silicon wafer. As the gate regions increase in size, the matching of the transistors would be expected to improve. While a depiction of only four transistor segments is shown in FIG. 7, one can expand the above technique to include any practical number of segments.

In a similar manner as described above, one could arrange the divided transistors in FIG. 7 into a square of two-by-two transistors rather than a rectangle of one-by-four as presently shown. The four transistors could then be permanently interconnected in the form of an "X" where the top left and bottom right transistors form one transistor and the top right and bottom left transistors form the second. This is another prior art technique to minimize transistor mismatch and is commonly referred to by those skilled in the art as cross-coupling transistors.

Cross-coupling and interdigitization are prior art techniques used to minimize mismatch that results from manufacturing anomalies that occur as processing gradients in addition to localized random errors.

Prior art techniques also utilize time domain techniques to minimize the effects of statistical mismatch. A chopper-stabilized amplifier is a prior art technique that employs a continuous digital clock signal applied to the mismatched elements in a prescribed fashion such that the average mismatch is driven to zero. Chopper-stabilized amplifiers are well known by those skilled in the art of amplifier design. Significant literature exists in the public domain to fully explain the operation of such amplifiers.

Similar to chopper stabilization, sampled data analog systems such as a pipelined analog to digital converter, utilize a concept known as dynamic element matching (DEM) to overcome element mismatch.

While time averaging solutions such as DEM and chopper stabilization are able to theoretically mask all vestiges of element mismatch in an analog circuit, many precision amplifier applications cannot tolerate the byproducts of a clock signal injected into the signal path. Two intolerable byproducts are long overload recovery time when the amplifier is driven into saturation and the introduction of switching noise into the signal path. Additionally, errors that drift faster than the amplifiers response time are not eliminated and therefore add error to the output in a manner similar to that produced by element mismatch. The present invention provides many of the benefits inherent in a time-averaging solution without introducing the deleterious effects listed above.

While not strictly a matching circuit solution, Flynn, et al., "Digital Calibration Incorporating Redundancy of Flash ADCs," May 2003, IEEE Transactions on Circuits and Systems, Vol. 50, No. 5, pp. 205-213, describes a calibration scheme whereby a group of elements are present in a system and the one element that has the prescribed level of performance is enabled into the circuit. This is similar to a manufacturing scheme whereby parts are "cherry-picked" before they are assembled into the final system. Cherry-picking is slang used to describe the process of investigating the performance of each element in a group and then selecting that one element that exhibits the best performance.

Cherry-picking is an extremely inefficient and costly solution in that a multiplicity of completed elements must be included on the die with the end result that only one will be utilized.

Summarily, electrical circuit element type, size, and location as well as cherry-picking parts and the introduction of an averaging clock signal are all prior art methods to manage input offset voltage errors. The present invention provides new methods that enable the use of smaller matching elements with less regard for element type, location, and circuit application, thereby improving the performance and lowering the production costs of analog integrated circuits.

BRIEF SUMMARY OF THE INVENTION

According to one embodiment, the present invention comprises a method for reducing possible operating parameter mismatch between first and second elements. The method comprises fabricating a plurality of like components each functionally similar to the first and the second elements, selecting components from the plurality of like components and interconnecting the selected components to construct the first element as a composite element, wherein the operating parameter mismatch between the composite element and the second element is limited based on assessment of operating parameter variation among the like components.

According to another embodiment, the present invention comprises a method for forming a first differential amplifier on an integrated circuit. The method comprises determining a desired operating parameter mismatch for the first differential amplifier, fabricating a plurality of transistors on the integrated circuit, selecting transistors from the plurality of transistors according to an analysis, connecting transistors from among the selected transistors to form a plurality of second differential amplifiers; and connecting the plurality of second differential amplifiers to form a composite differential amplifier having an operating parameter mismatch less than the desired operating parameter mismatch.

BRIEF DESCRIPTION OF THE DRAWINGS

The present invention can be more easily understood and the advantages and uses thereof more readily apparent when the following detailed description of the present invention is read in conjunction with the figures wherein:

FIG. 1 shows a typical one-stage MOS operational amplifier with three matched transistor pairs.

FIG. 2 shows a typical matched MOS differential pair including an equivalent input referred offset voltage source and equivalent output offset current source.

FIG. 3 shows a normal distribution of input offset voltage mismatch for a MOS transistor pair.

FIG. 4A shows a simplistic example of one type of MOS transistor manufacturing error that contributes to input offset voltage mismatch of an MOS amplifier as depicted in FIG. 1.

FIG. 4B is a cross-sectional representation of the example transistor of FIG. 4A.

FIG. 5 is a physical representation of the electrical circuit shown in FIG. 2 whereby M1 and M2 are depicted as a mismatched differential MOS transistor pair.

FIG. 6 is a chart that shows the improvement provided by using the present invention to improve the mismatch of a MOS transistor pair.

FIG. 7 shows a single MOS transistor divided into four similar but smaller MOS transistors.

FIGS. 8A, 8B, 8C, and 8D are electrical circuit representations of four MOS transistor pairs with input referred offset voltages.

FIG. 9A is an electrical circuit representation of the four transistor pairs shown in FIGS. 8A-8D and displayed in a manner consistent with a preferred embodiment of the present invention.

FIG. 9B is an electrical circuit representation of the equivalent composite MOS transistor pair built from the four transistor pairs on FIG. 9A.

FIG. 10 is a modification of the electrical circuit of FIG. 9A that demonstrates how the VOS error term inherent in a mismatched MOS transistor pair moves when the interconnection of the pair is varied in a manner consistent with that of the present invention.

FIG. 11A shows a preferred embodiment of the present invention when applied to a single transistor pair and indicates one possible interconnection of the pair.

FIG. 11B shows the logical inverse interconnection of the transistor pair of FIG. 11A.

FIG. 12 shows a preferred embodiment of the present invention when applied to a group of transistor pairs and indicates one possible interconnection of the group.

FIG. 13A shows an alternative embodiment of the present invention using resistor pairs instead of MOS transistor pairs.

FIG. 13B shows a modification of the electrical circuit of FIG. 13A and demonstrates how the mismatch of the resistor divider is altered when the interconnection is varied in a manner consistent with that of the present invention.

FIG. 14 shows a MOS transistor embodiment of the circuit shown in FIG. 11A.

FIG. 15A shows a MOS transistor embodiment of a matched current mirror element that could be used with a multiplicity of similar elements to build a composite matched MOS current mirror pair.

FIG. 15B shows a MOS transistor embodiment of a CMOS inverter.

FIG. 16 shows a preferred embodiment of the present invention where each transistor of a composite transistor pair can be independently switched.

FIG. 17 shows how the present invention can be applied to create a precision voltage divider using the embodiment of FIGS. 13A-B FIG. 18A shows an abbreviated circuit topology of a successive approximation register (SAR) analog to digital converter utilizing composite matched capacitor elements C1-C4.

FIG. 18B shows how control signals for the SAR converter of FIG. 18A are directed to the individual elements of a composite matched capacitor.

FIG. 19A shows an electrical schematic of the C1-C4 capacitor array used in FIG. 18A.

FIG. 19B shows a physical representation of the electrical schematic in FIG. 19A.

FIG. 20A shows an embodiment of a bipolar and resistor current source element that could be used to build a composite matched current mirror.

FIG. 20B shows an embodiment of a bipolar and resistor network element that could be used to build a composite matched differential amplifier input and amplifier output feedback network.

In accordance with common practice, the various described device features are not drawn to scale, but are drawn to emphasize specific features relevant to the invention. Like reference characters denote like elements throughout the figures and text.

DETAILED DESCRIPTION OF THE INVENTION

Before describing in detail the particular methods and apparatuses related to calibrating analog circuits using statistical techniques and overcoming the effects of component mismatches it should be observed that the present invention resides primarily in a novel and non-obvious combination of elements and process steps. So as not to obscure the disclosure with details that will be readily apparent to those skilled in the art, certain conventional elements and steps have been presented with lesser detail, while the drawings and the specification describe in greater detail other elements and steps pertinent to understanding the invention.

The following embodiments are not intended to define limits as to the structure or method of the invention, but only to provide exemplary constructions. The embodiments are permissive rather than mandatory and illustrative rather than exhaustive.

High performance analog integrated circuits frequently require post-manufacturing calibration to meet published performance specifications such as operational amplifier input offset voltage, bandgap voltage reference tolerance, amplifier common-mode rejection ratio, and numerous other specifications. The methods and apparatuses of the present invention permit analog integrated circuit manufacturers to minimize the costs of calibration while increasing the performance of the calibrated products. Higher performing products built for lower cost improve the profitability for analog integrated circuit manufacturers.

Performance specifications such as those listed above are achieved in part by a high degree of matching between like structures or elements on a silicon die. For example, to achieve low input-offset voltage in an analog operational amplifier the input differential transistor pair must be precisely matched. To achieve precise matching, prior art design techniques, as discussed above, have utilized a combination of large physical structures placed in an organized manner on the silicon die in tandem with a post-manufacturing calibration to achieve the final performance objective.

Given the foregoing discussion, the present invention provides methods and apparatuses for achieving a more efficient and higher degree of matching between two or more elements to lower the production cost, improve the performance and reduce drift of analog electronic systems.

All practical amplifiers exhibit mismatch in the input differential pair as well as mismatches between the other less significant matched pairs in the amplifier. FIG. 1 shows three matched pairs that are subject to mismatch: M1 and M2, M7 and M8, and M9 and M10. A mismatch in any one or all of the matched pairs of FIG. 1 will result in an input offset voltage error as shown in FIG. 2.

Given the foregoing mismatch issues and known solutions as described above, a requirement exists for a matching technique that has an improvement function much stronger than the square-root-dependent relationship achievable with fixed layout techniques. Such an approach will enable substantially more precise matching of elements in analog integrated circuits, reduce residual calibration requirements and thereby reduce drift.

The present invention provides a vastly superior improvement function whereby a group of statistically matched MOS transistor pairs are interconnected in a manner to build a composite matched MOS transistor pair such that the composite pair exhibits a smaller total random mismatch when compared to that achievable with prior art matching techniques.

FIG. 3 shows a typical Gaussian distribution of MOS transistor threshold voltage mismatches between two matched MOS transistors such as those in FIG. 1 and FIG. 2. Threshold voltage mismatch is a dominant source of mismatch among MOS matched pairs. As such, the threshold voltage mismatch is the dominant term affecting the input offset voltage error of a typical operational amplifier such as that shown in FIG. 1.

In a Gaussian or normal distribution, a large percentage of matched pairs have mismatch values close to the nominal mismatch of 0V. A smaller percentage of matched pairs exhibit a larger mismatch. The normal distribution also has positive and negative mismatches. For a perfectly symmetrical distribution the mismatch summation of all mismatch voltages approaches zero. In other words, if all mismatches in a perfect normal distribution are added together, the result would be a mismatch of 0 or no mismatch.

In a well-controlled manufacturing process, the distribution is sufficiently symmetrical to produce nearly such a result. The present invention takes advantage of the above phenomenon by building a composite matched pair from a group of matched pairs whose mismatch offset voltages sum to zero within a prescribed tolerance. FIG. 12 shows one embodiment of the present invention and more specifically how a group of four matched pairs are interconnected according to that embodiment to afford the benefits thereof.

One consideration for implementing the present invention, as applied to an embodiment comprising matched transistor pairs, determines how many transistor pairs are required to achieve a desired performance improvement and then how to interconnect those pairs. First will be a description of a method to determine the number of required pairs, then a method for determining how to interconnect the pairs.

An upper illustration in FIG. 7 depicts a practical MOS transistor such as transistor M1 or M2 shown in FIG. 5. As shown in FIG. 5, the channel length exhibits a random variation across the channel width. As described earlier, this random channel length is one contributor to MOS transistor pair mismatch.

One can slice the single transistor depicted in FIG. 7 into multiple smaller transistors as shown on the bottom of FIG. 7. When sliced, each of the smaller elements will also have random channel length effects and thereby will also have offset voltage mismatches if interconnected as transistor pairs. Furthermore, since the area of the gate region is now less than the whole transistor in the upper illustration, the variations of each element will be greater albeit they will still be random in nature.

While FIG. 7 depicts a slicing of one transistor into four sections, with a sufficiently large element one could slice any given transistor into 2 times n sections to construct n matched transistor pairs. If n is sufficiently large and the polarity of the n matched pairs is properly chosen, the distribution of offset voltage mismatches of the n matched pairs will be such that the summation is near zero in a manner similar to that depicted in FIG. 3 and described above.

There is described below a method for determining the required number of matched pairs, n, preferred to achieve a desired near-zero summation in a distribution. According to one embodiment, a computer program is used to determine the number of matched pairs.

An example program that was used to build the design guide chart shown in FIG. 6 required as input, n matched pairs with random offset voltage mismatches and produced as output a variable K. The goal of the program is to determine the optimum polarity of each one of n pairs such that a composite pair mismatch is minimized and then represent that result as a factor K where K equals the multiplier applied to an absolute one-sigma standard deviation. For example, a matched pair built from sixteen interconnected matched pairs whose offset voltage distribution is equivalent to that shown in FIG. 3 is reduced by the present invention from a near 5 mV one-sigma standard deviation to typically a 5 uV maximum deviation (5 mV multiplied by K=0.001).

More specifically, the input data into the example program was a set of n random numbers with a Gaussian distribution whose one-sigma variation was normalized to 1. All possible summations of the n random numbers were generated by multiplying each random number by plus or minus one and then adding together the results. For example, if n equals two, then there are four possible summations of two numbers. The summation that results in the value nearest zero is considered the optimum.

Consider the simple example where n equals two. Here, two random numbers, n(1) and n(2), are input into the program. The first combination is to simply add n(1) and n(2). This result would be stored. The next combination is to add n(1) and subtract n(2). This is the same as multiplying n(2) by a minus one and adding the result to n(1). For this second combination, the first summation is recalled and compared to the present summation. If the present summation is smaller (i.e. combination is closer to zero), the present summation replaces the previous summation and is now considered the optimum combination. In the alternative, the first summation is maintained.

The program then proceeds with a third combination where n(1) is subtracted from n(2). And once again the comparison process is executed to determine if the present summation is yet smaller. Finally the fourth combination is tested where both n(1) and n(2) are subtracted (i.e. multiply both numbers by a minus one and then add the resulting numbers). The comparison process is then executed for a final time.

The value that survives the comparison process through the end of the program represents the optimum combination of the random numbers. The combination of one and zero multipliers represents the polarities that should be applied to the respective pairs when interconnecting the pairs as taught in the present invention. That resulting interconnection will be the optimum matched combination of pairs to produce an optimum matched composite pair.

Recognize that the optimum summation value can be further viewed as an improvement scale factor that is applied to a starting random distribution whose one sigma standard deviation equals one. For example, and in the above case, if the optimum summation was 0.25, it can be assumed that the improvement factor is 0.25 for that one case.

The above method applies to testing a single example of one set of n normalized random offset voltages. In a practical manufacturing environment where it is necessary to yield an overall K=0.25 improvement factor for all manufactured composite matched pairs, n will be larger. To determine how large n must be, the program must test multiple sets of n random offset voltages. It is the worst case K that can then be claimed as the worst case expected improvement for a particular n. A chart of the worst case values of K for a given failure rate is a more appropriate design curve for choosing n.

This may be somewhat confusing in that the value of K on the y-axis that corresponds to an input value of n on the x-axis in FIG. 6 is actually the "worst of the best." Recognize that in a program such as that described herein, the resulting value of K for one set of n random numbers is the best K achieved for all possible summations of the n random numbers for that one set. Conversely, the worst value of K for all sets that utilize n random numbers in each set is the K value that should be utilized for a high yielding embodiment. Summarily, the charted value of K is the worst of the best.

Consider an example where the value of K is desired for the case where two pairs are utilized in the composite matched pair. Further assume that the value of K must be achieved for all composite matched pairs from a lot of four cases. Here the assigned variables are n equals two and M equals four where M represents the number of cases in the lot.

A possible set of results for the instant example could be K={0.001, 1.2, 0.05, 0.31}. For the first run, M=1, four possible summations were executed with one summation equaling 0.001. For the M=2 run, four possible summations were executed with the best K equaling 1.2. Notice that of all four runs, the M=2 run achieved the worst improvement. Therefore, on a chart similar to that shown in FIG. 6, the value of 1.2 should be charted for K on the M=4 curve. Summarily, even though one of the runs achieved a phenomenal improvement of K=0.001, one should not depend upon reliably achieving that result.

It bears repeating one last time. The charted value of K, and hence the design value, should be the "worst of the best".

In the example program described above, this was addressed by introducing the variable M into the program. As described above, M represents the number of cases that are tried for a design value of n random numbers. In the example program, M values of 4, 40, and 400 were tested.

Referring to FIG. 6, note that as M becomes large the improvement factor K approaches a limiting value. The number of cases, M, to test when building a set of design curves such as shown in FIG. 6 will depend upon the acceptable yield to an improvement factor K for that particular embodiment. If one failure in 40 is tolerable, then a curve built from 40 runs is acceptable. More likely the requirement will be one failure in one million runs.

It is not practical or necessary to run a computer simulation to generate a curve based upon one million runs. One need only test a sufficient number of cases to ascertain the limiting curve. And then one can simply increase the chosen value of n by one or two.

When reviewing the example program results charted in FIG. 6, one notes that after approximately n=7 matched pairs, the rate of error reduction increases dramatically. In an effort to establish a general guideline for choosing the required number of pairs, an approximate mathematical relationship was developed. The relationship represents the expected reduction factor K for the limiting case where M=400 test cases with a starting normal distribution of pair offset voltage mismatch of one sigma. It was determined that for n values greater than or equal to 7, the error reduction follows approximately the relationship:

$$K = \frac{1250}{2^n \cdot n}$$

The above equation was arrived at by first recognizing that the slope is inversely proportional to the number two raised to the power n. Then the numerator constant of 1250 and the denominator constant n were arrived at by testing different values in an attempt to define the best fit curve. A more exacting relationship can be developed using the methods of statistical calculus if the precise distribution of the random numbers is known and an upper boundary for M is set based upon the required yield to achieve a prescribed improvement factor K. For embodiments with simple distributions, such as that described in the present invention, the mathematics is relatively simple although the final interpretation will still require empiricism to establish a design curve such as that shown in FIG. 6.

Recognize that the input data for FIG. 6 assumed a normal distribution of offset voltages where the one sigma standard deviation was normalized to one. As such, the curves of FIG. 6 apply in general to most simple embodiments of the present invention where the distribution of any arbitrary mismatch term is also normal and the input data can be normalized to one.

Notwithstanding the above generalization, it is expected that most practical applications of the present invention will require computer aided analysis of an actual element distribution that is substantially more complex. While the data for a more complex distribution could still be normalized to one, the distribution of mismatch in absolute terms will be a larger percentage and result from substantially more than one source of mismatch. For example, if all sources of MOS transistor mismatch were taken into consideration, an improvement from 5 mV to 5 uV over all operating conditions of the composite matched MOS transistor pair would require more than sixteen matched pairs In some cases it may be preferable to utilize complex elements to build a complex composite element. FIGS. 20A and 20B are examples of complex elements that could be utilized in another possible embodiment of the present invention. FIG. 20A is a bipolar current source element that includes a bipolar transistor and emitter degeneration resistor. One terminal of the emitter degeneration resistor R1 is connected to a power supply voltage reference VSS. If a voltage is applied to the terminal V4, a current will flow into the collector of transistor Q1 at the terminal V5. Those skilled in the art of analog circuit design understand the operation of the classical analog circuit shown in FIG. 20A.

Typically both electrical circuit components in the complex element shown in FIG. 20A are manufactured and collocated on the same wafer. Despite these similarities, the components operate differently and will therefore impart different effects upon the current flowing into the collector of Q1. This is the same result that occurs when considering all of the independent factors that influence the mismatch of MOS transistor pairs as described above.

One could utilize the teachings of the present invention to build a composite matched current source pair from a multiplicity of complex current source elements such as the one shown in FIG. 20A. If such an embodiment were constructed, for similar reasons as detailed above, more complex elements would be required than that predicted in a set of design curves as shown in FIG. 6 where only a single contributing mismatch source was considered.

It is also noteworthy to point out that a composite matched current source pair embodiment that utilizes the FIG. 20A complex element can realize the improvement of a single parameter, namely improving the mismatch of a matched current source pair. This is true despite what appears to be a match based upon achieving two independent matches, namely a match between all type R1 resistors and all type Q1 transistors. Given the foregoing, it is possible with the present invention to realize an improvement in a match whereby the improvement is a result of mismatch sources associated with one component canceling the mismatch sources associated with the other component or components that constitute the complex element. Said another way, it is not necessary that each independent source of the mismatch be independently reduced. The independent sources of mismatch can also be compositely reduced.

Notwithstanding the foregoing, both components can be independently matched provided there is a technique for independently observing the mismatch of the independent components.

These same arguments apply to the complex element shown in FIG. 20B. The FIG. 20B complex element is comprised of a bipolar transistor Q2 and two resistors R2 and R3. This element can be utilized as one element of a group of like elements to form a matched composite differential transistor input and resistor feedback network. Such a network would be found in a classical analog circuit known as an instrumentation amplifier. In this case Q2 would be one-half of the differential input pair of the operational amplifier used in the instrumentation amplifier. R2 and R3 would connect to signal sources at the terminals V6 or V9, respectively. Those signal sources would normally be input or feedback signals associated with the instrumentation amplifier. Instrumentation amplifiers are analog circuits well known by those skilled in the art of analog IC design.

Referring back to FIG. 6, and considering once again the simple case of constructing the composite matched MOS transistor pair, note that an offset voltage reduction factor of approximately 1000 (K=0.001) is achievable for an optimum matched composite MOS transistor pair where each transistor in the pair is constructed from n=16, MOS transistors. When compared to the square root dependence factor, the curve representing K=1/sqrt (n) in FIG. 6, the improvement factor K is nearly 500 times better. Hence, a K factor improvement using the present invention with n=16 MOS transistor pairs is equivalent to a 250,000 times increase in MOS transistor area without the ensuing die costs and parasitic capacitance.

For a better appreciation of the results of FIG. 6, consider that the transistor area for the data collected for FIG. 3 is approximately 12 um$^2$ (2 transistors with 6 um$^2$ area each). Accordingly, it would take an equivalent transistor area of 3 mm$^2$ to produce the same result achievable using the present invention. Notwithstanding the shear economic benefit of dramatically reducing the required area, it is impractical with modern technology to build an analog amplifier using transistors that large.

Also looking at FIG. 6, note that for values approaching n=1, the expected improvement factor K equals 3 when 400 cases are tested (i.e. M=400 curve for high yield manufacturing). This is reasonable since with only one pair there is no possibility of reconfiguration for improvement.

As was described earlier, in some cases choosing a K value from the M=400 curve may not be sufficient: for example, when a precision match is required on a product with numerous other low yielding circuits. Such a case would exist if a single analog IC comprised multiple embodiments of the present invention utilized in multiple amplifiers on the same IC. Given the strong reduction rate for n greater than 7 though, n could be liberally increased with minimal penalty since each increase of n by 1 provides an approximate reduction of error by 2. For example, raising n from 16 to 19 is a 1.2× area increase but affords a nearly 10× reduction in error.

If one were to attempt a high-yielding, matching improvement by cherry-picking a matched pair from a group of matched pairs, in the case of a 1000-fold matching improvement, one would need approximately 33,000 different matched pairs. This would require at least a 33,000-fold increase in the required circuit area.

Given the foregoing, the present invention can be viewed as a method of converting one composite element into a virtually limitless number of candidate composite elements and "cherry-picking" that composite element that exhibits the objective match. Given that the number of possible composite elements is a binary function of the number of pairs, the matching results obtainable with the present invention is bounded only by the ability to measure the precision of the match in the presence of other circuit anomalies such as noise.

While the description of the present invention has presumed a Gaussian or normal random distribution, the techniques taught in the present invention can be utilized with any type of random distribution. Those skilled in the art of computer programming and statistical mathematics can produce a chart similar to the chart shown in FIG. 6 for other distribution types not described herein. Alternatively, the value for n can be arrived at empirically by experimentation using a trial and error technique.

The intent of the chart in FIG. 6 is to demonstrate how one set of random statistical results can be utilized to achieve an improved statistical result. While it is assumed that the data used as input to the computer program accurately represents a practical statistical distribution and it is further assumed that the computer program used to process that data is written to operate as described above, the present invention does not depend upon either of these factors and therefore the description nor the claims should not be bound by this.

Once the number of required matched pairs is determined, a circuit is required to enable interconnecting n pairs into one composite pair and also an algorithm for determining the best interconnection of those pairs for the lowest mismatch error.

A preferred embodiment of the present invention uses switches coupled with on-off or open-close control signals or actions to enable the interconnecting of the individual matched pairs into one composite pair to facilitate searching for the optimum interconnection. To understand how the switches are interconnected consider the pairs in FIG. 8A-8D.

FIGS. 8A-8D depict four matched transistor pairs that are to be interconnected into one composite matched pair. The pairs are W, X, Y, and Z. While the present invention contemplates an interconnection of more than four pairs of matched elements, for graphical convenience the description will contemplate only four pairs. Those skilled in the art of analog design will readily understand how to expand the present invention to include any number of pairs above or below the four pairs shown in FIGS. 8A-8D.

Each of the four pairs in FIGS. 8A-8D has five terminals and an input offset voltage source. The five terminals are labeled using the letters a, b, c, d, e and additionally the presence or absence of the character or characters. This technique is used to indicate that while terminal a' is electrically different than terminal a''', the function of the terminal is the same and may possibly be a part of the same composite terminal in the resulting composite element.

Terminals of type a are the gates of m1. Terminals of type b are the gates of m2. Terminals of the type c are the common source of the differential pairs. Terminals of the type d are the drains of m1. Terminals of the type e are the drains of m2. [Note: The use of a lower case prefix 'm' for labeling the transistors in FIGS. 8A-8D denotes that the transistor is potentially one element of a composite element labeled with an upper case prefix 'M'.]

The offset voltage sources labeled as VOS followed by a subscript refer to the random offset voltages that result from mismatches of the individual pairs.

FIG. 9A shows pairs W, X, Y, and Z of FIGS. 8A-8D configured in an array format. All type a terminals end in box A which is a composite terminal for one gate of the composite MOS pair in FIG. 9B. All type b terminals end in box B that is a composite terminal for the other gate of the FIG. 9B MOS pair. All type c terminals end in box C that is the composite terminal for the common sources of the FIG. 9B composite matched pair. All type d terminals end in box D that is a composite terminal for one drain of the composite MOS pair in FIG. 9B. And finally all type e terminals end in box E that is a composite terminal for the other drain terminal of the composite MOS pair in FIG. 9B.

As shown in FIG. 9A, all four matched pairs have an input offset voltage. If the pairs of FIG. 9A are interconnected such that all terminals inside a composite terminal box are interconnected and all pairs operate with the same transconductance, then the resultant offset voltage for the composite pair can be equivalently represented as the summation of the individual pair offsets. In the case of the array in FIG. 9A that voltage is equal to VOSa+VOSa'+VOSa"+VOSa'". Furthermore, if the summation of all offset voltage terms equals 0V the composite pair shown in FIG. 9B is considered to be perfectly matched. Given the data of FIG. 3, this is rarely the case, hence one object of the present invention.

Recognize that the composite element of FIG. 9B can be used in place of the input differential pair of an operational amplifier such as that shown in FIG. 1. When applying the present invention to matched MOS pairs such as that shown in FIG. 1, there are limitations on how the matched pairs may be interconnected and still maintain their designed function.

Consider, for example, that M1 of FIG. 9B corresponds to the transistor M1 associated with the V1 input of the amplifier and that M2 of the same figure corresponds to the transistor M2 associated with the V2 input of the same amplifier. The Plus and Minus terminal designations carry electrical significance in that these inputs control the output phase of the amplifier. For example, and referring to FIG. 1, if the Plus terminal rises in voltage relative to the Minus terminal, the current flowing into the drain of M1 will be larger than the current flowing into the drain of M2. It is this difference in current that is used inside the amplifier of FIG. 1 to provide voltage gain at the terminal Output in FIG. 1.

If the current into M1's drain rises, the current flowing out of M5's drain will fall. When M5's drain current falls, the voltage at the terminal Output will begin to rise. Therefore, any rise on the Plus terminal will affect a rise at the Output terminal in FIG. 1.

Referring back to FIG. 9B and FIG. 1, assume that the transistor pair M1 and M2 of FIG. 1 is constructed as composite transistor pair WXYZ in FIG. 9B. Further assume that all type a terminals of pairs W, X, Y, and Z are interconnected together and form a composite terminal A that is then interconnected as the gate terminal of M1 in FIG. 1. Further assume that all type b terminals of pairs W, X, Y, and Z are interconnected together and form a composite terminal B that is then interconnected as the gate terminal of M2 in FIG. 1. Further assume that all type c terminals of pairs W, X, Y, and Z are interconnected together and form a composite terminal C which is then interconnected as the common source terminal of M1 and M2 in FIG. 1. Further assume that all type d terminals of pairs W, X, Y, and Z are interconnected together and form a composite terminal D that is then interconnected as the drain terminal of M1 in FIG. 1. Further assume that all type e terminals of pairs W, X, Y, and Z are interconnected together and form a composite terminal E that is then interconnected as the drain terminal of M2 in FIG. 1.

With an assumed configuration as detailed above, any voltage rise on composite terminal A will affect an output voltage rise on the output of the amplifier in FIG. 1 in a similar manner as did a voltage rise on M1 of FIG. 1. If composite terminals A and B were swapped such that the Plus terminal of FIG. 1 was interconnected to the B composite terminal and the Minus terminal of FIG. 1 was interconnected to the A composite terminal, the operation of the amplifier would change such that a rising voltage on the Plus input would produce a falling voltage at the amplifier output in FIG. 1. This phase reversal of operation will render the amplifier in FIG. 1 useless.

Given the foregoing it is preferred that when replacing the matched pair of M1 and M2 in FIG. 1 with the present invention that the phase of the Plus and Minus inputs to the Output be maintained. In the case of the replacement matched composite pair this can be accomplished by simply swapping all type d and e terminals when type a and b terminals are swapped during the search for the optimum composite match.

It is important to note that in the case where the present invention is used to replace the M1 and M2 matched pair of FIG. 1, type c terminals are unaffected by any swapping of type a, b, d, or e terminals.

Referring to FIG. 9A again, consider that one possible and normalized offset voltage distribution could be as follows: VOSa=+1, VOSa'=0, VOSa"=+1, and VOSa'"=0. Under this scenario, the equivalent input offset voltage VOSwxyz would equal 1 plus 1 or simply 2. Using the present invention, if MOS matched pair W were rotated in a manner as depicted in FIG. 10, then the offset voltage VOSa would move from composite terminal A to composite terminal B. Furthermore, terminals a and b would be swapped as would terminals e and d.

Note that in FIG. 10 the equivalent offset voltage VOSwxyz is now equal to VOSa'+VOSa"+VOSa'"−VOSa. Using the above hypothetical series of normalized offset voltages; the effective input referred offset voltage of MOS transistor pair WXYZ would be equal to 0 representing a perfect cancellation of the offset voltage of the pair.

Further notice in FIG. 10 that the requirement to maintain proper phasing is maintained since terminal d and e were swapped simultaneously with the swap of terminals a and b. Also notice that no swapping is required for terminal c therefore it is shown in FIG. 10 as permanently interconnected together with all other type c terminals with no regard for the swapping of any gate or drain terminal.

In a similar manner as described above, there are fifteen other possible interconnections for interconnecting pairs W, X, Y, and Z to form the composite pair WXYZ. Given an offset voltage distribution such as that shown in FIG. 3, sixteen different offset voltage summations are possible. At least one of the possible interconnections will result in a minimum equivalent offset voltage and is thus considered the optimum interconnection. While sixteen combinations are possible, only eight unique combinations result since each combination has an equal but opposite polarity result. Offset mismatch is an absolute problem therefore polarity of the mismatch plays a lesser role in the precision of a match.

It should be readily apparent based upon the previous description that any number of pairs can be assembled into one array such as that shown in FIG. 9A. As described earlier, an increasing number of pairs will improve the achievable offset reduction. While FIGS. 9A and 10 depict an embodiment using four pairs, certain embodiments may utilize more than four pairs and more likely at least eight pairs.

To facilitate the variable interconnectivity required in the present invention the preferred embodiment utilizes switches with appropriate open and close signaling or actions as the means to swap terminals of the matched pairs. The switches used in the present invention may be of any type including MOS switches, bipolar switches, anti-fuse type switches, fuse type switches, or any other type switch that exhibits the characteristics of a switch as understood by those skilled in the art of analog integrated circuit design. An example embodiment of interconnectivity using switches is depicted in FIG. 11A.

In the case of interconnecting MOS transistor pairs, the preferred embodiment would utilize switches typically available using an MOS manufacturing process.

Referring to FIG. 11A there are eight switches required to facilitate the swapping of terminals a, b, d, and e. Terminal c does not require switches for the aforementioned reason.

To maintain proper phasing as described earlier, a prescribed relationship must exist between switches that are enabled for any one configuration.

Switch 1 of FIG. 11A depicts a closed switch. Switch 2 of FIG. 11A depicts an open switch. When using the matched pair depicted in FIG. 11A as one element of a composite matched pair to replace M1 and M2 in FIG. 1, one of two possible interconnections must be utilized. Closing switches S1, S3, S5, and S8 and opening switches S2, S4, S6, and S7 enables a first possible interconnection. Closing switches S2, S4, S6, and S7 and opening switches S1, S3, S5, and S8 enables a second possible interconnection. The first possible interconnection is depicted in FIG. 11A. The second possible interconnection is depicted in FIG. 11B. The interconnections shown in 11A and 11B are considered logical inverses of each other. The purpose of a logical inverse is to enable changing the interconnection of a matched pair, composite or otherwise, in a manner such that only the pair mismatch is observable after the change. Logical inverse interconnections are an important aspect of the present invention in that they enable the swapping of matched pairs to build the composite matched pair and simplify the measurement of the improvement or degradation of the swap.

In the present invention more than one pair would typically be utilized in the composite matched pair to replace a mismatched transistor pair such as that depicted as M1 and M2 in FIG. 1. FIG. 12 is a depiction of one possible embodiment that includes four matched pairs. Each pair W, X, Y, and Z of the four matched pairs in FIG. 12 can be interconnected in two ways. One interconnection represents a multiplication of the offset voltage by plus one and the second interconnection represents a multiplication by minus one. Collectively, there are sixteen possible interconnections. Of the sixteen, only eight interconnections are unique as previously discussed.

To replace the matched pair consisting of M1 and M2 in FIG. 1 with the composite pair depicted in FIG. 12, composite terminal A must be interconnected to replace the gate terminal of transistor M1 in FIG. 1. Accordingly, all other composite terminals should then be interconnected to replace the appropriate terminals in FIG. 1. Namely, composite terminal B would interconnect to replace the gate terminal of M2. Composite terminal D would interconnect to replace the drain terminal of M1. Composite terminal E would interconnect to replace the drain terminal of M2. And finally composite terminal C would interconnect to replace the source terminals of M1 and M2.

A significant body of the description has contemplated improving the match between composite pairs by utilizing multiple elemental pairs. But matched pairs can also be constructed from matched transistors. Hence, it is also possible to interconnect the composite matched pair in FIG. 12 by changing the interconnection of each of the eight total transistors individually.

Referring to FIG. 16, note that this is almost exactly the same circuit diagram as shown in FIG. 12 with the exception that each pair W, X, Y, and Z has their drain terminals connected to the same composite terminal. For example, pair W has its terminals d and e interconnected to the composite terminal D whereas in FIG. 12 terminal d is interconnected to composite terminal D and terminal e is interconnected to composite terminal E. To transform the FIG. 12 embodiment of pair W into the FIG. 16 embodiment of pair W only the interconnection of terminals e and b of Pair W were altered. In short, the interconnection of pair W in FIG. 16 is not treated as a pair at all despite being depicted as a pair. These same arguments apply to the pairs X, Y and Z in FIG. 16.

Despite the asymmetry in the FIG. 16 interconnection of what appears to be four individually drawn matched pairs, the composite matched pair is still constructed from eight transistors with four transistors in each composite transistor. The resulting composite matched pair is still electrically equivalent to a composite matched pair such as that obtained in FIG. 12 where interconnections are managed on a pair-wise basis.

Similarly as shown in FIG. 16, the individual transistors can be interconnected in any manner, provided each resulting composite transistor of the composite matched pair is comprised of an equal number of transistors. For example, the terminals d and e of pair W could both be interconnected to the composite terminal E.

The benefit of individually interconnecting the transistors of the FIG. 16 embodiment is that fewer transistors would be required to achieve a desired improvement in the mismatch relative to an embodiment such as FIG. 12 where pairs are interconnected. Summarily, matched pairs are not required at all to realize the benefits of the present invention; rather only matched elements no matter the complexity.

To better understand the concept of interconnecting individual matched elements rather than pairs, consider that the present invention depends upon generating a large number of random matching results that can be mapped onto a distribution similar to that shown in FIG. 3. Further consider that each interconnection of elements of an embodiment generates one random matching result. Given a sufficient number of random results and a sufficiently wide mismatch tolerance, there will be at least one random result that lies within the tolerance window.

Whereas the embodiment as previously described for FIG. 12 enables eight unique random results, managing the interconnections as described above for the FIG. 16 embodiment can result in 35 random results. Since the number of combinations is a significant consideration in determining the overall matching improvement, an embodiment can be physically smaller where individual elements are interconnected.

If the area of all transistors is the same, the standard deviation of the mismatch will be the same. Given the same standard deviation, the improvement factor K depends almost entirely upon the number of possible combinations. Hence, more combinations equates to more opportunities to achieve a result within the prescribed tolerance window. As such, the prescribed window could be made smaller leading to a better result. Alternatively, one could utilize fewer transistor elements with a larger standard deviation and rely upon the larger number of random combinations possible to achieve the same matching tolerance.

Despite the improved efficiency of an embodiment that interconnects individual MOS transistor elements, there are applications where pairs will be preferred. Such a case exists when the matching is across a physically large area. In that case, the mismatch effects resulting from systematic voltage drop across the interconnecting metal for the common terminal C of FIG. 12 is minimized by the common mode rejection of the differential pair.

When constructing an embodiment of the invention utilizing individual elements, a chart such as the one in FIG. 6 can still be utilized to determine the number of elements preferred to achieve the matching objective.

The formula for calculating the possible number of combinations when interconnecting pairs is:

$$C_{pairs} = \frac{2^n}{2}$$

The formula for determining the number of possible combinations when individually interconnecting the transistors within a pair is:

$$C_{individual} = \frac{(2 \cdot n)!}{2 \cdot (n!)^2}$$

Inputting the number four for the value of n into the formula for pairs results in eight unique combinations. Thirty-five combinations result when inputting the number four into the equation for interconnecting individual transistors. To yield at least thirty-five combinations when interconnecting pairs requires more than 6 pairs, as determined from the pairs combination equation above.

Once a decision is made regarding the required number of matched transistor pairs, and the pairs have been assembled into a variable interconnection scheme such as that shown in FIG. 12 or FIG. 16, and the resulting composite matched pair has been interconnected into a circuit application as described above, a search algorithm must be implemented to determine the interconnection of matched pairs to achieve the desired matching improvement.

Since the matching error on any particular matched pair is random, the preferred algorithm for choosing the best interconnection is to review all possible interconnections by first enabling the interconnection and then measuring the improvement. In the case of offset voltage improvement one would search for an offset voltage near 0V. To search any less than all possible interconnections will potentially result in a less than an optimum result.

If the optimum interconnection is determined in this rote manner, the settling time of the analog circuit will play a significant role in the time to determine the optimum interconnection. For example, to make a precise analog measurement of offset voltage in a practical amplifier such as shown in FIG. 1, it may take 1 ms to settle each change to the interconnection of a composite matched pair replacing M1 and M2. If sixteen pairs are utilized in the composite matched pair, the settling time of 33,000 interconnections is required. Under this scenario, the total determination time can be as long as 33 seconds.

Alternatively, and for elements that exhibit linear operation around the matching point, the mismatch contribution of each individual pair could be measured and a computer then utilized to predict the results for each interconnection without actually measuring the results of the interconnection. Such a process would require understanding the mathematical relationship and resulting effect of each contributing pair of the composite pair.

Modern computers or fixed logic circuits such as a field programmable gate array can execute precise mathematical computations much faster than the settling time of a precision analog circuit. Whereas the earlier example required a 1 ms settling time for measuring the interconnection result, a digital computation may take less than 10 ns. This method can be employed to reduce the determination process from a maximum of 33 seconds to a maximum of 0.33 seconds: a more practical maximum testing time for analog IC manufacturing.

More explicitly, and referring to FIGS. 9A and 10, recognize that as pair W is rotated, the offset voltage of the composite pair WXYZ will change in accordance with the offset voltage introduced by pair W. For small signal offset voltages this is effectively a linear operation. One could measure each change in the offset voltage of the composite pair as each of four pairs is rotated and then have a computer or other logic circuit calculate the expected results for all eight unique combinations. The resulting minimum combination could then be considered the optimum. Provided the resolution of the measurement is sufficiently precise and linear, this method will greatly speed up the determination of the preferred interconnection to minimize the offset error.

To overcome the measurement limitations of linearity and precision, one can establish a computer-calculated comparison window that defines a threshold of acceptable mismatch. Here, the computer would calculate all possible combinations and build a memory stack of those combinations that result in a mismatch within the prescribed window of uncertainty. The combinations that are stored on the memory stack can then be individually interconnected to determine the best interconnection. This would be an appropriate method where extremely large numbers of combinations must be tested to a very high precision. Those skilled in the art of computer programming and analog IC testing can construct any one or all of the above match determination algorithms.

To minimize the computer memory requirements, it is not necessary to store a list of all possible combinations. One could also store only the data used to calculate the interconnections. Under this scenario one could test each interconnection as they were calculated until an acceptable interconnection has been achieved.

In certain cases, it may be acceptable to execute a less than optimum search algorithm. One such algorithm is to first measure and then stack opposing offset values towards zero error. For example, given a measured set of normalized offset values of: [+1, +0.5, 0, 0, −0.5, −1], a composite pair could be built by stacking equal magnitude, opposite polarity pairs together. In this case, Pair A would be comprised of [+1, −1, 0] and Pair B would be comprised of [+0.5, −0.5, and 0]. The composite offset of both pairs would then be equal to 0, a perfect minimum. Mathematically, [+1+(−1)+0=0] and [+0.5+(−0.5)+0=0]. In general, and with a sufficiently large n, such an approach will produce a result better than that achieved by merely building stationary larger elements in accordance with prior art techniques, but will infrequently achieve the precision of a total search.

Yet another less than optimum algorithm is to conduct a random search for the optimum interconnection utilizing fewer than the total number of interconnections possible.

Reducing the mismatch between elements in an electrical circuit must also take into consideration the drift of the match. For example, MOS transistors exhibit substantial performance drift over temperature and supply voltage variations. In that MOS device operation is complex with performance being dictated by a multiplicity of physical effects, a match at one operational point may not be maintained at a secondary operating point.

If matching performance drifts, it is an indication that not all relevant sources of drift have been matched within the composite elements. To enable a precision composite match when there are multiple sources of mismatch, it is preferred that additional elements be included in the composite elements beyond the number predicted in a chart such as that shown in FIG. 6. Furthermore, the operational characteristics must be changed to observe the drift while measuring the interconnection of the elements.

In a practical manufacturing environment, it is not possible to cycle operational characteristics such as temperature to test all possible interconnections. Usually only one temperature cycle is performed. Therefore another method must be used that requires only one cycle of the operating environment.

By constructing the composite elements from a larger group of elements than predicted in a drawing such as FIG. 6, a large number of successful interconnections are possible. While at one operating point only one interconnection is required, this may not be the interconnection that is acceptable at the secondary operating point. Therefore, while searching for the successful interconnections at one operating point, a list, or a technique for compiling a list, should be constructed that includes or enables the determination of all of the possible successful interconnections. This list can then be utilized as the source of interconnections to test at the secondary operating point. The best match at the secondary point will then be the best overall match across both operating environments.

To facilitate managing a procedure as described above, it is preferred that a technique be established to track the physical matching circuit with the interconnection list as the matching circuit moves through a production test environment. One preferred technique assigns a unique serial number to each circuit such that the serial number is used to identify the interconnection list. In this manner, when the matching circuit is retested at the secondary operating point, the serial number can be read back and the requisite interconnection list recalled or constructed.

Assigning a serial number to the matching circuit on an analog integrated circuit can be accomplished in numerous ways as is known by those skilled in the art of IC design. For example, one could program a digital word on the integrated circuit with laser link fuses, switches, EEPROM bits, FLASH memory bits, or any other means of storing a serial number.

An important consideration in choosing the number of elements in a group is the search time for finding the optimum result. This is especially true in that a group of n=16 pairs will require testing nearly 33,000 interconnections to find the optimum interconnection. Therefore, search time may be the overriding consideration that drives the decision to build a composite matched pair based upon a stacking of values or other less optimum search algorithm.

Given the foregoing, it is also an aspect of the present invention to combine multiple searching algorithms to more rapidly find an acceptable minimum result. An example of a composite search algorithm is to first measure all mismatches and drop those that are significantly divergent from the others in the group prior to a rote search. This narrows the distribution prior to starting the search. With a narrower starting distribution, fewer interconnections may be tested to achieve a desired reduction.

Referring to FIG. 12, and under the condition that pair W is substantially divergent from the other pairs, one could disconnect pair W entirely from the circuit by opening all switches associated with pair W. Then the search for the optimum interconnection would be completed utilizing only the pairs X, Y, and Z. Pair W would remain disconnected from the composite matched pair.

Another embodiment of the present invention is to utilize a larger number of matched pairs than that predicted in a drawing similar to that in FIG. 6 and then determine experimentally the optimum partitioning of how many matched pairs of the total pairs are stacked and how many are searched by rote.

Yet another embodiment is to utilize a larger group of matched pairs than that included in the final composite matched pair and then search the entire group enabling only those pairs that yield the required match. In effect, the pool of possible random matching results is in part generated by including or excluding pairs from the composite pair rather than only changing the polarity of the interconnection of those pairs within the composite pair.

Recall that changing the interconnection of a pair in the FIG. 12 embodiment is equivalent to multiplying the offset of the pair by a plus one or minus one and then summing all of the offsets towards zero. In this instant case, one additional option exists and that is to simply exclude the pair. Excluding, or disconnecting, a pair also generates a random composite result and can also result in an acceptable match. To disconnect a pair one need only open or turn off all switches associated with the pair.

While the above embodiment is less efficient than the preferred embodiment (i.e. not utilizing all available matched pairs and enabling random result generation by enabling or disabling a pair), this approach also minimizes the number and location of switches required to facilitate the requisite number of testing combinations. Specifically, and referring to FIG. 12, all type S1 and S3 switches could be permanently shorted to the composite terminals A and B, respectively. All type S2 and S4 switches could be removed. All type S6 and S7 switches could be removed. Under these circumstances, a composite matched pair comprised of only three pairs could be interconnected by merely disconnecting the appropriate S5 and S8 type switches.

For example, and assuming the enabling/disabling embodiment just described, the switches identified as S5 and S8 in FIG. 12 could be opened and no current would flow through pair W. Therefore the composite matched pair possible in FIG. 12 would include only pairs X, Y, and Z. In a similar manner, pair X could be removed from the composite matched pair. In all, four separate combinations are possible for building a composite matched pair using three matched pairs.

When the above embodiment is utilized in place of the matched pair of M1 and M2 in FIG. 1, the switches in FIG. 12 that would normally interconnect to the V1 and V2 signals no longer exist. This then eliminates any external circuit considerations that might have existed had switches been present. For example, some MOS type switches have maximum turn on voltages lower than the input voltages possible at the input of an amplifier such as shown in FIG. 1. Had the switches been in place, the input operating voltage would be limited to the voltage tolerance of the switches. If bipolar transistors were utilized rather than MOS transistors, the bipolar base currents would introduce mismatch by virtue of random voltage drops across the switches.

It should be obvious that any number of matched pairs could be included in an embodiment such as described above. And it should be further obvious that the composite matched pair could be built out of any number of matched pairs greater than one up to including all of the available matched pairs.

This particular embodiment differs from the Flynn, et al., "Digital Calibration Incorporating Redundancy of Flash ADCs," May 2003, IEEE Transactions on Circuits and Systems, Vol. 50, No. 5, pp. 205-213, solution in that a composite element is interconnected to achieve the required performance as opposed to merely interconnecting one "cherry-picked" element from a group of candidate elements. Every time the interconnection of a composite element in the present invention is altered, a new random result is generated and thereby a new opportunity is created to achieve the matching objective. This applies even if one of the elements of a group of elements that can be interconnected to form a composite element is actually disabled or disconnected from the composite element.

An important object of any search algorithm is that the optimum matched interconnection must be observable. In the case of FIG. 2 this can be accomplished by monitoring the differential offset current IOS when both Plus and Minus terminals are interconnected together. When the difference in current between the drain current of M1 and the drain current of M2 is zero, IOS equals zero and the composite matched pair can be considered perfectly matched. In that such a condition is rarely the case it is more practical to set an upper limit on the mismatch and search through all possible interconnections until that interconnection that lies below the prescribed upper limit is reached.

When a matching relationship is not directly observable, an alternative indirect technique is required. Such a situation exists when monitoring the offset voltage mismatch improvement as one searches through a composite matched pair used as the input matched pair of an operational amplifier such as that shown in FIG. 1.

For example, the drain currents of transistors M1 and M2 in FIG. 1 are not generally accessible in a practical amplifier design. Hence, if a composite matched pair is used to replace transistors M1 and M2, the composite pair mismatch will also not be directly observable.

One solution to enable indirect observation of mismatch improvement is to monitor the relative change in the input offset voltage between one interconnection of composite matched pairs and the logical inverse of the same interconnection.

For the purposes of example, assume that FIG. 12 is a composite matched pair replacing the matched pair of M1 and M2 in the amplifier of FIG. 1. Further assume that the Output terminal of the FIG. 1 amplifier is interconnected to the V2 (Minus) terminal of the same amplifier. Those skilled in the art of operational amplifier design will recognize that interconnecting the output of an amplifier back to its V2 (Minus) input constitutes an amplifier with a gain of 1 whereby any voltage on the Plus terminal is replicated by the output stage of the amplifier and presented at the input of the V2 (Minus) terminal.

For the condition where all matched pairs in FIG. 1 are perfectly matched with no error, the difference voltage between the V1 (Plus) and V2 (Minus) terminals is very nearly 0V and predominately dependent upon the open loop gain of the amplifier. In a well-designed amplifier the open loop gain is sufficiently high that such a near 0V condition occurs.

In the more likely scenario where all matched pairs have finite mismatch, the voltage difference between the V1 (Plus) and V2 (Minus) terminals will be non-zero and will be determined primarily by the degree of mismatch of all the matched pairs in the circuit not only the composite pair replacing M1 and M2.

For the condition where multiple mismatched pairs contribute to the observed offset voltage, a change in interconnection of one matched pair, composite or otherwise, will result in a change of the offset voltage, but not necessarily a change that can result in 0V. Therefore it is very likely that the optimum interconnection for a single composite matched pair used in the amplifier of FIG. 1 will rarely be observable as an offset voltage of 0V.

Alternatively, if one observes the offset voltage change while switching from one interconnection to the logical inverse of the same interconnection, one can infer that all change is directly related to the interconnection of the matched pair.

Referring back to FIGS. 9A and 10, recognize that if VOSa=0V then there will be no change in VOSwxyz regardless of whether pair W is interconnected as in FIG. 9A or as in FIG. 10. If no change occurs when switching from one interconnection to the logical inverse of that interconnection, the matched pair can be considered perfectly matched. This condition is true regardless of whether the matched pair is one matched pair of a composite matched pair or the entire composite matched pair.

Given the foregoing clarifications, it is another aspect of the present invention that the preferred technique for deeming a composite matched pair as sufficiently matched is to measure the difference in matching when changing the interconnection of the composite matched pair to the logical inverse of that same interconnection. Such an operation entails simultaneously logically inverting all matched pairs of a composite matched pair.

In the case of the amplifier of FIG. 1, if all matched pairs shown in the amplifier are replaced with composite matched pairs as described in the present invention, and if each composite matched pair is optimized using the logical inversion technique described above, then the offset voltage of the amplifier as a whole will be minimized.

In a similar manner as described above for using the present invention to improve the matching of a MOS differential input transistor pair such as M1 and M2 shown in FIG. 1, the other matched pairs of FIG. 1 may be improved by the present invention. Note that the pair M7 and M8 not only shares a common source terminal but also a common gate terminal. Therefore, the composite matched pair replacing M7 and M8 will require fewer switches since the gate terminal much like the source terminal requires no switches. As is known by those skilled in the art of analog integrated circuit design, M7 and M8 of FIG. 1 represent MOS transistor current mirrors.

FIG. 14 depicts, among other things, an embodiment of FIG. 11A (or 11B) of the present invention using MOS elements as switches for a differential input pair such as the M1-M2 differential pair in FIG. 1.

FIG. 15A-B shows an embodiment of the invention applied to the construction of an MOS current mirror element. In a like manner similar to the circuit of FIG. 12, a multiplicity of the circuits in FIGS. 14 and 15A-B are required to enjoy the benefits of the present invention.

Referring to FIG. 14, transistors M34 and M35 represent a differential NMOS transistor pair and are equivalent to the transistors m1 and m2 in FIG. 11A. Transistors M30 and M31 operate to form a CMOS switch. The CMOS switch performs the same function as switch S1 in FIG. 11A. In a like manner, the CMOS switches of M32-M33, M36-M37, and M38-M39 perform the same functions as switches S2, S3, and S4 in FIG. 11A, respectively.

Transistors M26, M27, M28, and M29 are PMOS switches. The nature of the voltages present at the terminals Cascode-Plus and Cascode-Minus are such that a CMOS switch is not required to affect the results described in the present invention. Therefore, M26, M27, M28, and M29 are equivalent to the switches S5, S6, S7, and S8 in FIG. 11A.

The transistors M40 and M41 operate as a digital CMOS inverter. The inverter provides the complementary voltage signaling that will affect an opening or closing of the CMOS switches surrounding the differential pair M34-M35. The voltage signaling required in FIG. 14 can be originated by any electrical signaling source that is physically on or off the integrated circuit. The signaling can also be permanently programmed in memory on the integrated circuit. The primary requirement of the signaling is to affect the searching of interconnections that will result in an optimum composite match.

Referring to FIG. 14, if the voltage at the gate terminals of M40 and M41 is a logical high, the voltage at the drain terminals will be a logical low. If a logical high voltage is applied to a gate of a NMOS transistor connected as a switch, the switch is considered on. If a logical low voltage is applied to a gate of an NMOS transistor connected as a switch, the switch is considered off.

In a similar manner but reversed, if a logical high voltage is applied to a gate of a PMOS transistor connected as a switch, the switch is considered off. If a logical low voltage is applied to a gate of a PMOS transistor connected as a switch, the switch is considered on.

Given the foregoing, to affect an interconnection of the FIG. 14 embodiment that is similar to the interconnection depicted in FIG. 11A, the signal present at the gate terminals of M40 and M41 must be a logical high.

Alternatively, to affect an interconnection of the FIG. 14 embodiment that is similar to the interconnection depicted in FIG. 11B, the signal present at the gate terminals of M40 and M41 must be a logical low.

In the instant case, a signal that is considered logic high is a voltage of sufficient amplitude to cause the NMOS transistors operating as switches to always operate in their triode region and the PMOS transistors operating as switches to be non-conducting. A signal that is considered logic low is a voltage of sufficient amplitude to cause the PMOS transistors operating as switches to always operate in their triode region and the NMOS transistors operating as switches to be non-conducting.

In that a multiplicity of type FIG. 14 elements is required in a preferred embodiment of the invention, a like multiplicity of logic high and low signals are also required. This multiplicity of independent logic signals affects the different interconnections necessary to search for the optimum interconnection of all type FIG. 14 elements.

The terminals Plus and Minus in FIG. 14 are so labeled to indicate that when the MOS differential pair element is used to construct a composite matched pair as taught in the present invention, and is further used to replace the MOS differential pair M1-M2 in FIG. 1, the terminals provide the same function as the terminals V1 (Plus) and V2 (Minus) in FIG. 1.

The transistors M20 and M21 in FIG. 15A represent a PMOS current mirror pair element. Transistors M22, M23, M24, and M25 are PMOS switches. In a like manner as improving the mismatch of a composite MOS differential pair, a multiplicity of these circuits is required to enjoy the benefits of the present invention when improving the mismatch of a composite MOS current mirror.

When configured as a composite current mirror pair in accordance with the teachings of the present invention, the composite current mirror pair can be used to replace the current mirror pair of M7-M8 shown in FIG. 1. In this case, the terminal Current Mirror Bias Voltage is equivalent to the gate terminals of M7 and M8 in FIG. 1. Additionally, the terminals Cascode-Plus and Cascode-Minus are used to replace the drain terminals of M7 and M8 in FIG. 1, respectively.

In a like manner and for the same functional purpose as M40 and M41, the transistors of M42 and M43 form an inverter in FIG. 15B and control PMOS switches M22, M23, M24, and M25.

As previously described, the embodiments in FIGS. 14 and 15A and 15B can be substituted into the amplifier in FIG. 1. Under this scenario, two inverters and two control signals are used to enable independent control of the match searching process for each FIGS. 14 and 15A element utilized in the composite matches. While this is not strictly necessary, the required number of matched pairs is less given the lower complexity of the composite element. Namely, an element that is a single matched pair is less complex than an element that is both a matched pair and a matched current mirror. The issues associated with affecting a complex versus a simple composite match have been presented earlier in the description.

While the embodiment shown in FIG. 14 utilizes MOS switches, it is not always practical to utilize MOS switches at the input terminals of an amplifier. For example, MOS switches add capacitance and leakage currents to the input terminals. Additionally, MOS switches in high voltage applications are often unable to tolerate the same voltages as the input transistors. For these applications the use of MOS switches would limit the input operating voltage, input bandwidth, and input impedance.

For applications where MOS switches are not preferred, fusible links may be utilized at the input terminals provided there is a secondary method to observe the mismatch and thereby decide which fusible links remain and which fusible links are opened.

If such a case applied when replacing the matched pair of M1-M2 in FIG. 1 with the FIG. 14 differential matched pair element embodiment, the CMOS switches could be replaced with fusible links. In this case, the Plus and Minus terminals would be initially shorted together while determining the optimum interconnection.

Recognize that when the Plus and Minus terminals are shorted the differential pair circuit operates similar to a current mirror since both gate terminals ate shorted and both source terminals are shorted. Therefore the interconnection of the shorted matched pair can be determined in a manner as would be done with a current source. Once the optimum interconnection is determined, the fusible links can be opened in a manner that preserves both the pair match and input signal phase.

In that calibrating analog circuits using the present invention is effectively a digital process that is based in part upon observing zero relative movement in a matched relationship, it is a further aspect of the present invention to integrate a digital system for determining the match on a silicon die along with an embodiment of the present invention. A co-located, match-measuring, digital system can be utilized not only to execute the initial match determination, but also to maintain the match over long periods of time or environmental changes. This will enhance the long-term performance of the entire analog circuit or system whose calibration depends upon continuous high precision matching of elements. For example a temperature sensor either on or off the chip can be employed to detect a movement in ambient temperature. For some element matching embodiments this temperature movement will alter the match. In this instance, the temperature sensor can then demand the on-chip digital system to re-determine the match.

Yet another example of how to maintain a long-term match is to invoke a re-determination of the match based upon elapsed time. Aging is an important analog circuit performance object that requires long-term, high-degree matching between elements. For example, bandgap reference circuits are precision voltage reference circuits that suffer from long-term and short-term aging.

The concept of zero relative movement in a relationship implies that no absolute precision equipment is required for measuring the degree of matching between elements (i.e. a precision voltage reference). To determine a match one need look primarily at changes between an interconnection and that interconnection's logical inverse. This measuring system requires a comparator circuit with an ability to sample the result of a first interconnection and then compare that result to the result of the logical inverse of the first interconnection. When the relationship between the two interconnections is within a prescribed tolerance window, the match has been achieved.

Comparator circuits are well known by those skilled in the art of analog circuit design. Numerous public domain resources are available to teach the construction of such circuits.

While a significant body of the description of the present invention contemplates the matching of MOS pairs to improve upon the statistical mismatch of offset voltage, those skilled in the art of analog integrated circuit design can now envision numerous applications of the present invention using a multitude of different elements other than MOS transistors and improving upon numerous other statistical relationships such as common-mode rejection ratio, power supply rejection ratio and others. Statistical relationships such as common-mode rejection and power supply rejection are relationships well known by those skilled in the art of amplifier design. In some circumstances, even the magnitude of low frequency electrical noise can be lowered using the present invention. Low frequency, input-referred noise of a differential pair is also a statistical relationship.

For example, MOS transistors are notorious for exhibiting substantial 1/f electrical noise. A dominant source of MOSFET 1/f noise is oxide traps inside the imperfect gate oxide of the transistor. In fact, the offset voltage of a MOS transistor pair is affected in part by the number and location of these traps in each transistor of the pair. Therefore, a minimizing of the pair offset voltage, to a limited extent, can help to lower the differentially observable 1/f noise in that offset voltage can also be considered a dc noise.

Considerable literature exists in the public domain to explain these and other statistical relationships.

One matching application of the present invention other than that described herein for matched MOS transistors is to improve the mismatch of resistor divider networks since resistor divider networks also exhibit Gaussian distributions of divider ratios. FIG. 13A depicts one embodiment of the present invention when applied to the statistical calibration of a resistor divider network.

FIG. 13A shows a composite resistor divider QUV that is built in a manner similar to that for MOS transistor pairs depicted in FIGS. 9A and 9B. Note that the nomenclature method used in FIGS. 13A-B is different from the nomenclature method in FIGS. 9A-B in that the composite element is referenced by the name of the composite terminals rather than the names of the individual resistor pair elements that make up the composite element. This is done so that each of the eight resistors could have a separate label that then simplifies the equations that show the calculated parallel resulting resistance. No other inference should be drawn from this change in nomenclature.

In a similar manner as previously described, the resistor terminals q and v may be swapped to alter the values of resistor R(Q,U) and R(U,V) and thereby alter and improve the accuracy of the resistor divider network.

FIG. 13B shows one of sixteen possible interconnections whereby a resistor pair comprised of Rj and Rk is swapped such that terminal q of Rj is moved from composite terminal Q to composite terminal V while terminal v of Rk is moved from composite terminal V to composite terminal Q. By swapping terminals q and v, resistors R(Q,U) and R(U,V) are modified and hence the resistor divider QUV is also modified.

As was clarified in the earlier description of interconnecting matched MOS pairs, there are only eight unique interconnections when rotating pairs in that half of the sixteen possible interconnections result in duplicative parallel combinations. The only difference is that composite resistor R(Q,U) would be on the bottom of the divider and composite resistor R(U,V) would be on the top.

As was previously described, an alternative embodiment would be to move each resistor individually. In this case, one has eight rotating elements that must comprise two equal sized groups. When the matching search is executed within those limitations there are 35 possible interconnections that can be tested for the requisite matching objective. This will yield a more precise match for a given mismatch standard deviation when compared to the eight possible interconnections when rotating pairs.

Many circuit applications are possible with the invention. Virtually all analog circuits entail some level of matching requirement to achieve their performance specification. One possible application is to utilize the invention to construct a precision digital to analog converter.

FIG. 17 shows a five level voltage divider that could be utilized in a digital to analog converter application. Digital to analog converters are precision analog circuits well known by those skilled in the art of precision analog IC design.

To produce the various division ratios present at the divider output terminals, three matches must be determined. Those matches are the three QUV composite divider networks Rx(QUV), Ry(QUV), and Rz(QUV). The calibration of the structure proceeds as follows.

First, Rz(QUV) is matched in a manner similar to that for the MOS matched pair described herein and as described above in conjunction with FIGS. 13A and 13B. When the match is achieved, the voltage at the point ¼ VDD is precisely ½ of the voltage across terminals Q and V.

In a similar manner, Ry(QUV) is also matched. Likewise, the voltage at the center of Ry(QUV) is then ½ of the voltage between VDD and ½ VDD. Finally, Rx(QUV) is matched. Once Rx(QUV) has been matched, three reference voltages are available whereby each successive reference voltage is precisely ¼ (VDD-VSS) different than the terminal voltages above or below it. This scheme can be expanded to include any number of division ratios.

It is important to note that resolving the matches of Ry(QUV) and Rz(QUV) does not necessarily yield matches between a divider pair made from Ry(QUV) and Rz(QUV). The determination of a match only yields a match between those elements present in the composite element. Given the foregoing, it should be obvious that Rx(QUV) does not achieve the precise division at the point ½ VDD by merely considering the elements that make up Rx(QUV). The parallel combinations of (QUV) and Rz(QUV) add a mismatch term that must be also be compensated by the matching of Rx(QUV).

As a result of the foregoing, it is further important to note that the process of matching Rx(QUV) effectively "pulls" the mismatch of a divider made from Ry(QUV) and Rz(QUV) towards a match. This concept of resolving a match is another element of the present invention.

Namely, a composite divider can be utilized to pull the ratio of another divider, composite or otherwise, towards a match without including that secondary ratio in the matching search. This aspect of the invention can be utilized to trim, for example, the resistor network of an instrumentation amplifier without directly matching the primary resistors in the network.

Another application of the present invention is to build the matched elements required in the construction of an analog to digital converter. FIG. 18A is a simplified schematic for a successive approximation register (SAR) type analog to digital converter. SAR analog to digital converters are well known by those skilled in the art of precision analog IC design. Numerous public domain sources are available to teach the construction and operation of such a circuit. The description below relates how to utilize the present invention to build the matched bits used in a SAR type converter.

Referring to FIG. 18A, C1, C2, C3, and C4 represent varying capacitor bit weights as are commonly used in a SAR type analog to digital converter. They can be binary weighted or thermometer weighted. A thermometer weighted bit is one that holds a unit charge similar to at least one other bit in the capacitor array. Said another way, each capacitor is a one-to-one match to the other capacitors. The present description will detail a method to construct and resolve the match of C1, C2, C3, and C4 if they are thermometer weighted bits. Once the capacitors are matched as thermometer bits, they can be combined to form binary weighted bits.

FIG. 19A shows a simplified electrical schematic of how the thirty-two capacitors would be interconnected in accordance with the present invention. FIG. 19B shows an equivalent physical representation. Note that both arrays have thirty-two capacitors divided into four rows and eight columns. Further note that in a final interconnection, the location of each capacitor in the physical array will be at a random location throughout the physical schematic.

In the present invention, matching is achieved by building composite elements from a group of matched elements by interconnecting the elements in distinct groups. In the case where numerous matches must be built, as in the SAR case, a large group of elements is required. It is not practical with a large group of elements to search all possible combinations for the matches.

For example, consider the situation where C1, C2, C3, and C4 each require eight elements for generating sufficient interconnections to achieve a requisite match. Under this scenario a total of thirty-two capacitors are required in the group. To divide the capacitors into four separate groups of eight capacitors would require investigating over ten million combinations.

To simplify the search for determining the interconnection of the group of plates a more optimum method than rote searching through thirty-two plates is to first build a division of the plates into two capacitors, say C[1-2] and C[3-4] as shown near the bottom of FIG. 19B. Each interim capacitor would be comprised of sixteen plates. Rather than searching for a match with sixteen plates though, it is preferred to manage the interconnections using two plates as one plate since only the randomness of eight elements is required to achieve the requisite match. This reduces the first rote search from thirty-two individual plates to sixteen dual-plates. As such, less than 6,500 combinations must be tested to build two capacitors.

For example, and referring to FIG. 19B, note that plate r1c1 and r1c2 are shown as one group of two plates. Both of these plates can be controlled as one plate while executing the first division of thirty-two plates into two groups of sixteen plates.

To achieve a further division by two such that four capacitors result, each group of sixteen capacitors can be further divided into two groups of eight. As a result of this process, four unique capacitors are interconnected and less than 20,000 combinations need be tested.

FIG. 18B shows how each plate of the capacitor array is interconnected to test any given combination of plates to form a composite matched capacitor. Here the term 'plate' refers to a capacitor element used as one element in a composite matched capacitor element. C1a is one plate of the C1 capacitor shown in FIG. 18A and interconnected with the other C1 plates as shown in FIG. 19A.

Note that all FIG. 18B type capacitors have equivalently three switches S11, S12, and S13 connecting one side of the capacitor to either Vin, Vref, of Vss. To combine a capacitor plate into a composite capacitor, one must program the address for each FIG. 18B type capacitor so that the appropriate set of thermometer control signals are decoded and then used in the related set of switches. A sharing of control signals by a group of element capacitors or plates is operationally equivalent to interconnecting the capacitor elements in the group so they form a composite capacitor.

As is the case with most embodiments of the present invention, the partitioning of a group of elements into composite elements is random. In the case of the capacitor array in FIG. 19A, any one capacitor plate in the capacitor array in FIG. 19B can be an element of any composite capacitor element in FIG. 18A.

For graphical convenience a description with only four capacitors has been presented. It will be obvious for those skilled in the art how this description can be expanded to include any number of thermometer bits.

FIG. 18B shows graphically the process of dividing a large capacitor array into thermometer bits by proceeding through a series of divisions by two. It is preferred that each division by two be carried out to a matching precision greater than the precision required in the final division.

To simplify the measuring of the mismatch of plates in the FIG. 19A embodiment, one could utilize the lower order bits, or LSBs, shown in FIG. 18A to report the mismatch. This would be affected by operating the SAR (successive approximation register) converter while interconnecting plates. The digital output code of the SAR converter would carry the information necessary to determine the optimum interconnection of plates. To extend the precision of the SAR converter to maximize the precision of the measurements once could utilize the technique of ADC oversampling. Oversampling increases the effective number of bits of an ADC. The techniques of oversampling are well known by those skilled in the art of analog IC design. Numerous public domain resources exist that teach how to extend the precision of an ADC.

Whereas a resistor embodiment such as that shown in FIG. 17 will suffer from voltage drop across the switches that affect the interconnections, a capacitor embodiment does not. This is because a direct current does not flow during operation of a capacitor embodiment.

Voltage drop across the switches in any embodiment that conducts a direct current will affect the precision of the match. It is therefore preferred that switches utilized in an embodiment of the present invention be placed in signal paths where there is no direct current or in a location where the switch voltage drop does not affect the circuit precision. If this is not possible, then a sufficiently low voltage drop switch can be utilized to minimize the effect on matching precision.

Referring to FIG. 14, note that the MOS switches are placed in two types of locations. The first location is in series with the gates of MOS transistors M34 and M35. MOS transistor gates do not conduct direct current. Therefore these switches do not affect the precision performance of the embodiment.

The second location of switches in FIG. 14 is at the drain terminals of M34 and M35. Unlike the MOS transistor gate terminals, the drain terminals do conduct a direct current. Notice though that the voltage drop across the switches occurs at the drain terminals of the MOS transistors. Voltage drops at the drain terminals of MOS transistors operating in saturation mode do not have a significant impact on the drain current provided they are sized for precision analog operation. Such a situation occurs in the case where the FIG. 14 embodiment is used to replace M1 and M2 in FIG. 1.

To size a MOS transistor for precision analog operation requires, in part, insuring that the early voltage of the transistor is large relative to the magnitude of the voltage drop across the MOS transistor. This problem is further minimized for differential pairs in that the difference in voltage drops affects the precision rather than the absolute voltage drop at one transistor of the pair. That difference is typically one order of magnitude less than the absolute voltage drop even in the presence of large switch mismatch (i.e. 10%).

The above considerations for switch voltage drops apply equally to bipolar transistors and are addressed in a similar manner.

For example, the benefit of utilizing a complex network such as shown in FIG. 20B is that the base current of Q2 does not flow directly through a switch and thereby create another source of differential pair offset voltage or mismatch. This would be required if one were to build solely the operation amplifier differential input pair as one composite element and the resistor network as a separate composite element. One would still need to utilize switches at the V6 and V9 terminals, but these terminals can be driven by low impedance signal sources and thereby cancel most of the switch induced error including moving the switch parasitic capacitance, if any, out of the feedback loop.

Despite the design considerations for managing switch voltage drop in the presence of a direct current, the techniques described earlier for managing complex composite element matching can also be utilized to overcome this issue. Namely, the switch voltage drop also exhibits a random variation. And in a like manner as taught in the present invention, this random variation can be minimized by including the switch voltage drop random variations into the determination of the number of complex elements required to achieve a match.

In addition to resistor dividers, DACs, and SAR converters, other applications of the present invention include improving matching of bipolar transistors, bipolar/resistor current sources, current mirrors, instrumentation amplifier resistor networks, and others.

It should also not be construed that the present invention only relates to one-to-one matching of elements. Any matching relationship, even including non-electrical relationships, can be improved using the present invention whenever a statistical relationship exists between two or more elements albeit for numerous quantities other than just offset voltage; for example the resistor ratios described earlier and depicted in FIG. 13a.

Once again referring to FIG. 13A, one could interconnect terminals q" and q'" to the composite terminal V while leaving terminals v" and v'" also at composite terminal V. In this condition the divider ratio would be 2:6. To improve the matching of such a divider network one would swap either or both terminals q and q', both initially interconnected to composite terminal Q, while simultaneously swapping any of the other terminals initially interconnected to terminal V including the added terminals of q" and q'".

With such an interconnection there is a disproportionate number of resistors that interconnect to form R(Q,U) when compared to the number that constitute R(U,V). As such the improvement function will be less than that achievable for a 1:1 ratio with a similar number of matched resistor pairs. To improve the achievable mismatch under such a condition, one need only add more matched resistors interconnected to composite terminal Q and a correspondingly larger number interconnected to composite terminal V while maintaining the desired matched ratio.

Referring to FIG. 18A and given the earlier description of building thermometer bits in a SAR type converter, the resulting SAR capacitor bits of C1, C2, C3 and C4 could be combined to build binary weighted capacitor bits. For example, C1 and C2 could be combined such that the combination is a factor of two relative to C3 or C4. With sufficient thermometer bits a multiplicity of binary scaled bits could be constructed. Binary weighted elements are frequently used in all types of analog to digital and digital to analog converters.

Bandgap voltage reference circuits, similar to resistor dividers, employ the use of non-unity ratios between matched bipolar transistors. Those skilled in the art of bandgap voltage reference design will benefit using the present invention to improve such non-unity ratios.

Element matching in integrated circuit design has primarily been a concern for engineers when designing analog integrated circuits. This is now changing such that digital engineers are also concerning themselves with component mismatch. More specifically, the delay through logic gates constructed on ultra deep submicron CMOS processes exhibit substantial statistical variations. These variations are directly related to the mismatch of the transition points of the logic gates. The transition points, or rather the input voltage levels that correspond to a logical one or logical zero state, are in part related to the threshold voltages of the transistors that comprise a logic gate such as a CMOS inverter. As presented earlier in the description, MOS transistors exhibit statistical variations in threshold voltage.

CMOS inverters are well known by digital integrated circuit engineers. The construction and operation of this and other common digital circuits are well documented in public domain literature.

Given the foregoing, it should be apparent that the teachings of the present invention can also be utilized to construct digital circuits with minimized mismatch in signal propagation and logic input voltage transition points.

It will now be readily apparent that any statistical relationship between practical elements can be improved utilizing the techniques detailed in the present invention. Therefore it should not be construed that the present invention relates only to the improvement of input offset voltage for matched MOS transistor pairs or even statistical relationships found solely in electrical circuit applications. It should further not be assumed that an element is only a single structure (i.e. MOS transistor, resistor, capacitor, etc.). For example, an element could be as complex as an entire first stage of an amplifier similar to the amplifier shown in FIG. 1 or less complex such as the elements shown in FIGS. 20A and 20B. In all of those cases, the composite element would be built using a multiplicity of elements interconnected in a manner similar to that described in the present invention.

In other embodiments, one or more of the MOSFETS and bipolar junction transistors as described herein is replaced by an opposite polarity MOSFET or bipolar junction transistor. The associated gate drive signals and power supply voltages are modified to accommodate the doping characteristics of the opposite polarity MOSFET or bipolar junction transistor, while providing the functionality of the present invention. With an appropriate change in the polarity of the associated elements, references to high logical levels or states herein can be replaced by low logical levels or states. Additionally, the described MOSFETS can be replaced by other transistor types, including a bipolar junction transistor or a junction field-effect transistor.

Although certain exemplary descriptions herein refer to matching of MOSFETS in the context of a differential pair, the teachings of the present invention are also applicable to improving the mismatch between other electronic and electrical components, such as resistors, capacitors, inductors, junction field effect transistors and bipolar junction transistors.

While the present invention has been described with reference to preferred embodiments, it will be understood by those skilled in the art that various changes may be made and equivalent elements may be substituted for the elements thereof without departing from the scope of the invention. The scope of the present invention further includes any combination of elements from the various embodiments set forth herein. In addition, modifications may be made to adapt a particular situation to the teachings of the present invention without departing from its essential scope. Therefore, it is intended that the invention not be limited to the particular embodiments disclosed, but that the invention will include all embodiments falling within the scope of the appended claims.

What is claimed is:

1. A method for limiting variation of a parameter between elements to within a predeterminable limit, comprising:
   providing a plurality of like components each providing a similar function and each having a first operating characteristic which is substantially the same among different ones of the components subject to differences predominantly attributable to manufacturing variations;
   forming a first composite element by functionally associating a first combination of the like components and forming a second composite element by functionally associating a second combination of the like components,
   wherein selection of the first and second combinations is according to a configuration defined after the components are manufactured and results in each of the first and second composite elements exhibiting variation of the parameter within the predeterminable limit.

2. The method of claim 1 wherein, during operation of both composite elements, the selected first and second combinations result in less parametric variation between the composite elements than would result if the first composite element were formed of a third combination of the like components.

3. The method of claim 1 wherein during operation of both composite elements the selected first and second combinations result in less parametric variation between the composite elements than would result if the first composite element were formed of any other combination of the like components.

4. The method of claim 1 wherein:
   the first and second composite elements are of the same functional type, said type taken from the group consisting of metal-oxide field effect transistors, bipolar junction transistors, capacitors, resistors and inductors, or any combination thereof; and
   the operating characteristic is taken from the group consisting of offset voltage, threshold voltage, reference voltage, amplifier common mode rejection ratio, resistance, inductance and capacitance, or any combination thereof.

5. The method of claim 1 wherein all of the components are electrical components formed on the same integrated circuit.

6. The method of claim 1 wherein each of the components in each series comprises a transistor and at least one resistor.

7. The method of claim 1 wherein a value of the parameter for the first and second composite elements that is within the predetermined limit is directly related to variations in a like parameter associated with the first operating characteristic among components chosen for the first combination.

8. The method of claim 7 wherein the parameter and the like parameter are voltages.

9. The method of claim 1 further comprising:
   forming at least a third composite element and at least a forth composite element by associating a third combination of like components and a fourth combination of like components from the like components in the first combination that forms the first composite element, wherein:
   prior to forming the third composite element, variations in the first operating characteristic among components forming the third combination and among components forming the fourth combination are assessed, and assessed variations provide a basis to select components of the third combination and provide a basis to select components of the fourth combination so that the third and fourth composite elements exhibit variation of the parameter within a second predeterminable limit.

10. The method of claim 1 wherein the number of possible combinations of like components is greater than 64.

11. The method of claim 1 wherein the manufacturing variations are predominantly random and, prior to forming the first and second composite elements, variation in the first operating characteristic among two or more components forming the first combination and among two or more components forming the second combination are assessed, and assessed variations provide a basis to select components of the first combination and provide a basis to select components of the second combination.

12. A method for limiting variation of a parameter between elements to within a predeterminable limit, comprising:
   providing a plurality of like components each providing a similar function;
   forming a first composite element by functionally associating a first combination of the like components and forming a second composite element by functionally associating a second combination of the like components, wherein, prior to forming the first and second composite elements, variations in a first operating characteristic among two or more components forming the first combination and among two or more components forming the second combination are assessed, and assessed variations provide a basis to select components of the first combination and provide a basis to select components of the second combination so that the first and second composite elements exhibit variation of the parameter within the predeterminable limit, wherein variations in the operating characteristic among components is characterized by a random distribution.

13. The method of claim 12 wherein the random distribution is a Gaussian distribution.

14. A method of limiting variation in functional performance between first and second composite elements comprising the steps of:

providing a series of like components, each exhibiting at least one characteristic function which is substantially the same among different ones of the components, differences in the at least one characteristic function predominantly attributable to manufacturing variations wherein, after manufacture of the like components, association of the components to form each composite element is selectable;

after manufacture of the like components, forming the first composite element by interconnecting a first group formed of individual ones in the series of components and forming the second composite element by interconnecting a second group also formed of individual ones in the series of components, such that selection of components for each of the first and second composite elements limits variation of the at least one operating characteristic function in the first and second composite elements to within a predeterminable limit.

15. The method of claim 14 wherein measurable variation in said functional performance between the elements is limited based on two selections of combinations of variations in the characteristic function among the multiple ones of the like components relative to one another and assignment of components to each group based on the relative assessment.

16. The method of claim 14 applied to formation of a differential amplifier wherein the like components are transistors and the measurable variation is an offset voltage such that the first and second groups are selected from a plurality of possible combinations characterized by a potential range in offset voltage wherein a possible third combination of transistors would provide a composite element exhibiting a relatively high offset voltage and a possible fourth combination of transistors would provide a relatively low offset voltage.

17. The method of claim 14 wherein, prior to forming the first and second composite elements, an assessment is made of variations in the at least one characteristic function among multiple ones of the like components used to form the first and second composite elements so that assessed variations provide a basis to select components in each of the first and second composite elements with each of the first and second composite elements exhibiting variation in the at least one characteristic function within the predeterminable limit.

18. The method of claim 14 wherein each of the composite elements is a transistor and the predeterminable limit is selected to achieve a desired level of matching of an electrical characteristic between the two composite elements.

* * * * *